United States Patent
Branch et al.

(10) Patent No.: US 8,692,592 B2
(45) Date of Patent: Apr. 8, 2014

(54) DIGITAL STORAGE ELEMENT ARCHITECTURE COMPRISING INTEGRATED 2-TO-1 MULTIPLEXER FUNCTIONALITY

(75) Inventors: Charles M. Branch, Dallas, TX (US);
Steven C. Bartling, Plano, TX (US);
Dharin N. Shah, Gujarat (IN)

(73) Assignee: Texas Instruments Incorporated, Dallas, TX (US)

( * ) Notice: Subject to any disclaimer, the term of this patent is extended or adjusted under 35 U.S.C. 154(b) by 1562 days.

(21) Appl. No.: 11/172,534

(22) Filed: Jun. 30, 2005

(65) Prior Publication Data
US 2007/0001733 A1 Jan. 4, 2007

(51) Int. Cl.
*H03K 21/00* (2006.01)

(52) U.S. Cl.
USPC .......................................................... 327/115

(58) Field of Classification Search
USPC .......... 327/199–202, 210–213, 215, 218–219
See application file for complete search history.

(56) References Cited

U.S. PATENT DOCUMENTS

| | | | |
|---|---|---|---|
| 4,495,629 A | 1/1985 | Zasio et al. | |
| 4,974,241 A | 11/1990 | McClure et al. | |
| 5,015,875 A | 5/1991 | Giles et al. | |
| 5,280,203 A | 1/1994 | Hung et al. | |
| 5,406,134 A | 4/1995 | Menut | |
| 5,432,463 A * | 7/1995 | Wong et al. | 326/32 |
| 5,721,740 A | 2/1998 | Moon et al. | |
| 5,726,990 A | 3/1998 | Shimada et al. | |
| 5,742,224 A * | 4/1998 | Gadducci et al. | 340/146.2 |
| 5,784,384 A | 7/1998 | Maeno | |
| 5,812,561 A | 9/1998 | Giles et al. | |
| 5,920,575 A * | 7/1999 | Gregor et al. | 714/726 |
| 6,237,122 B1 | 5/2001 | Maki | |
| 6,381,704 B1 | 4/2002 | Cano et al. | |
| 6,389,566 B1 | 5/2002 | Wagner et al. | |
| 6,446,229 B1 * | 9/2002 | Merrick et al. | 714/724 |
| 6,501,315 B1 | 12/2002 | Nguyen | |
| 6,614,276 B2 | 9/2003 | Robertson et al. | |
| 6,693,460 B2 | 2/2004 | Kanba | |
| 6,708,303 B1 | 3/2004 | Gallia | |
| 6,788,105 B2 | 9/2004 | Kono | |
| 6,919,875 B2 | 7/2005 | Abe et al. | |

(Continued)

OTHER PUBLICATIONS

Khan, Waheed U. et al., U.S. Appl. No. 10/952,289, filed Sep. 28, 2004, entitled, "High Speed Energy Conserving Scan Architecture,", 18 pages including 4 pages of Formal Drawings.

*Primary Examiner* — Lincoln Donovan
*Assistant Examiner* — Khareem E Almo
(74) *Attorney, Agent, or Firm* — John R. Pessetto; Wade J. Brady, III; Frederick J. Telecky, Jr.

(57) ABSTRACT

A digital storage element comprises a master transparent latch that receives functional data signals from data input ports and scan data signals from a scan input port. The data input ports are coupled to a two-input, one-output multiplexer adapted to receive the functional data signals and to selectively output one of the functional data signals. The digital storage element also comprises a slave transparent latch coupled to the master transparent latch, the slave transparent latch comprising dedicated functional data and scan data output ports. While operating in a scan mode, a first clock signal is used by the slave transparent latch and a second clock signal is used by the master transparent latch, wherein the first and second clock signals are non-overlapping.

6 Claims, 18 Drawing Sheets

(56) References Cited

U.S. PATENT DOCUMENTS

| | | |
|---|---|---|
| 6,986,089 B2 | 1/2006 | Hill et al. |
| 6,998,896 B1 | 2/2006 | De La Cruz et al. |
| 7,038,494 B2 * | 5/2006 | Morton ............................ 326/93 |
| 7,109,772 B2 | 9/2006 | Tohsche |
| 7,200,784 B2 | 4/2007 | Dervisoglu et al. |
| 2001/0050585 A1 * | 12/2001 | Carr ............................... 327/277 |
| 2003/0093734 A1 | 5/2003 | Zhang et al. |
| 2003/0188241 A1 * | 10/2003 | Zyuban et al. ................. 714/726 |
| 2004/0075479 A1 | 4/2004 | Gupta |
| 2004/0095176 A1 | 5/2004 | Uvieghara |
| 2005/0005214 A1 * | 1/2005 | Ueda ............................. 714/726 |
| 2005/0091562 A1 | 4/2005 | Krishnamoorthy et al. |
| 2005/0162192 A1 * | 7/2005 | Rhee ............................. 326/113 |
| 2005/0216806 A1 * | 9/2005 | Verwegen ...................... 714/726 |
| 2006/0085707 A1 | 4/2006 | Khan et al. |
| 2006/0095819 A1 * | 5/2006 | Bhatia ........................... 714/726 |

* cited by examiner

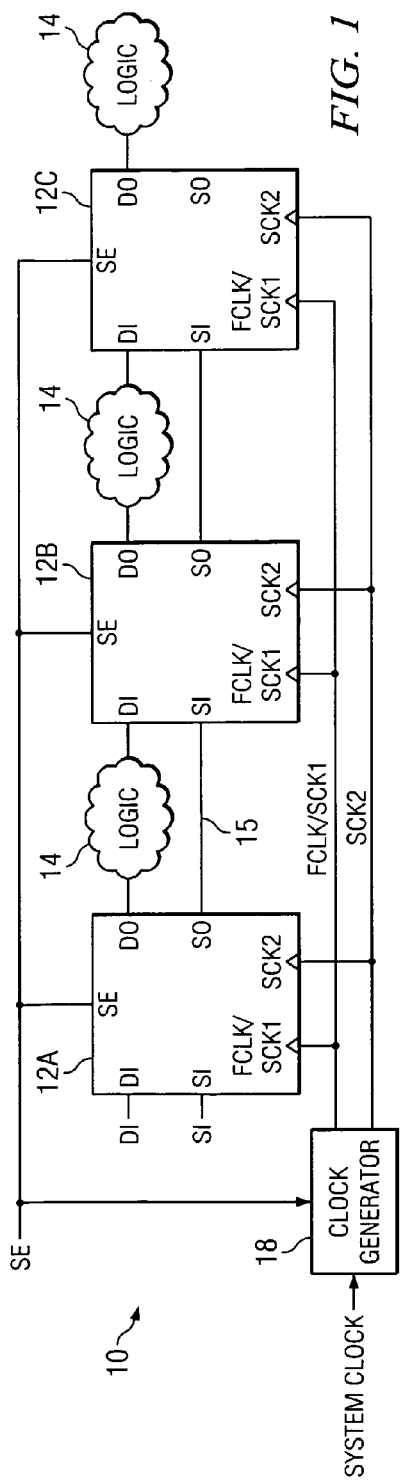
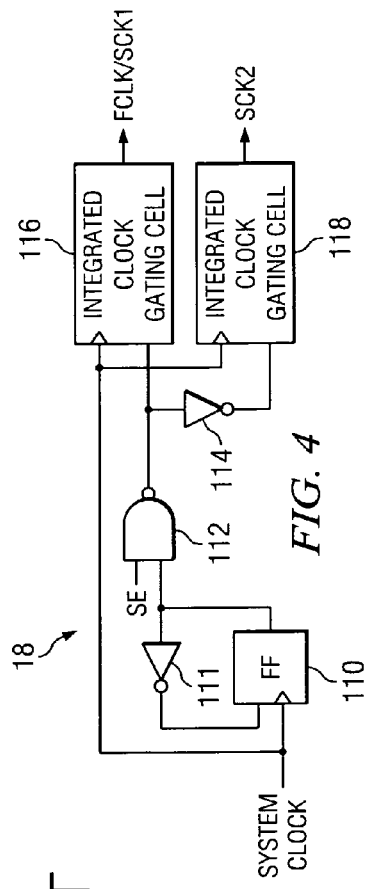
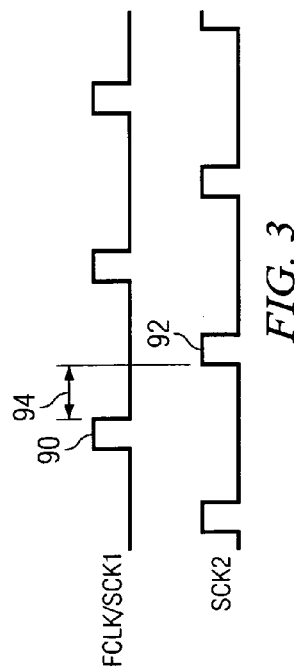
FIG. 1
FIG. 4
FIG. 3

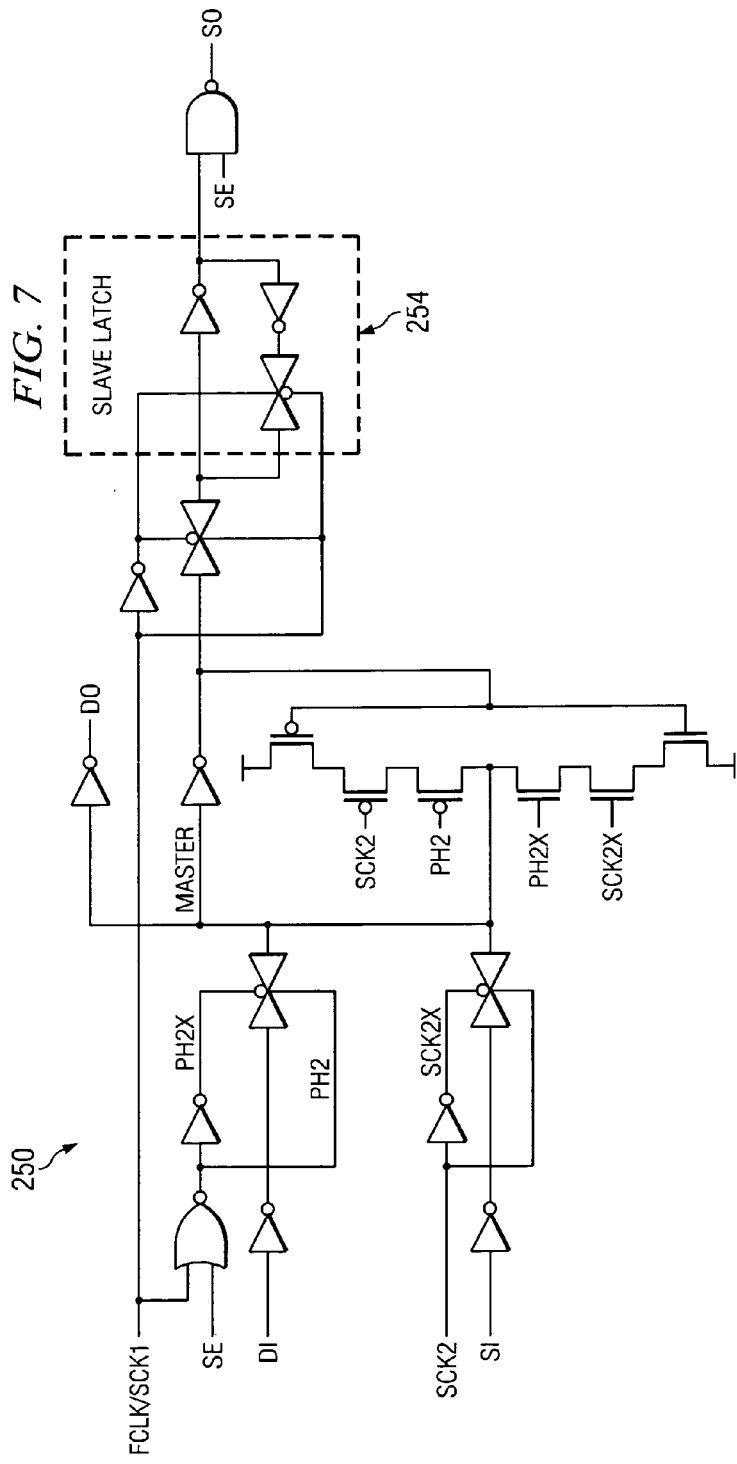
FIG. 7
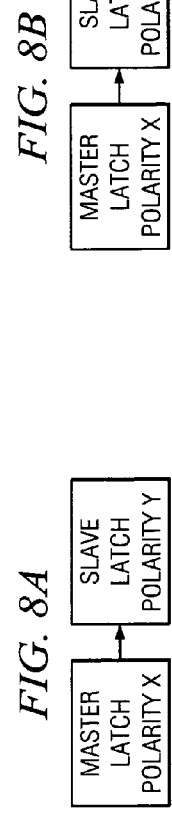
FIG. 8A
FIG. 8B

DIGITAL STORAGE ELEMENT ARCHITECTURE COMPRISING INTEGRATED 2-TO-1 MULTIPLEXER FUNCTIONALITY

CROSS-REFERENCE TO RELATED APPLICATIONS

This application relates to the following commonly assigned co-pending applications entitled: "Digital Storage Element Architecture Comprising Dual Scan Clocks And Gated Scan Output," Ser. No. 11/172,534, filed Jun. 30, 2005, (1962-26800); "Digital Storage Element With Dual Behavior," Ser. No. 11/171,537, filed Jun. 30, 2005, (1962-26900); "Digital Storage Element Architecture Comprising Dual Scan Clocks And Preset Functionality," Ser. No. 11/171,612, filed Jun. 30, 2005, (1962-27000); "Digital Storage Element Architecture Comprising Dual Scan Clocks And Reset Functionality," Ser. No. 11/172,242, filed Jun. 30, 2005, (1962-27100); "Digital Storage Element With Enable Signal Gating," Ser. No. 11/171,174, filed Jun. 30, 2005, (1962-27200); "Digital Storage Element Architecture Comprising Integrated 4-To-1 Multiplexer Functionality," Ser. No. 11/171,528, filed Jun. 30, 2005, (1962-27300); "Digital Storage Element Architecture Comprising Integrated Multiplexer And Reset Functionality," Ser. No. 11/171,535, filed Jun. 30, 2005, (1962-27400), all of which are incorporated by reference herein.

BACKGROUND

Integrated circuits (ICs) generally include numerous digital storage elements (e.g., flip-flops, latches) as at least some of the constituent components. Scan-based techniques (e.g., Automatic Test Pattern Generation (ATPG) techniques) are often employed to test the integrity of the IC. The integrity of the IC is tested by sending a predetermined sequence of bits forming a test pattern into the IC, shifting the sequence of bits through the digital storage elements of the IC, shifting result bits out of the IC, and then comparing the result bits with expected bits to verify whether the IC operates in a desired manner. Issues of set-up time violations, hold-time violations, and unnecessary power consumption characterize the quality of the design.

SUMMARY

In accordance with at least one embodiment of the invention, a digital storage element comprises a master transparent latch that receives functional data signals from data input ports and scan data signals from a scan input port. The data input ports are coupled to a two-input, one-output multiplexer adapted to receive the functional data signals and to selectively output one of the functional data signals. The digital storage element also comprises a slave transparent latch coupled to the master transparent latch, the slave transparent latch comprising dedicated functional data and scan data output ports. While operating in a scan mode, a first clock signal is used by the slave transparent latch and a second clock signal is used by the master transparent latch, wherein the first and second clock signals are non-overlapping.

In another embodiment, an integrated circuit comprises a plurality of digital storage elements, each digital storage element comprising a master transparent latch coupled to a slave transparent latch. The master transparent latch receives functional data signals from data input ports and scan data signals from a scan input port and the slave transparent latch comprises dedicated functional data and scan data output ports. Each digital storage element operates in a functional mode or in a scan mode and, while in the scan mode, a first clock signal is used by the slave transparent latch of each digital storage element and a second clock signal is used by the master transparent latch of each digital storage element, wherein the first and second clock signals are non-overlapping. The data input ports are coupled to a two-input, one-output multiplexer that receives the functional data signals and selectively outputs one of the functional data signals.

In accordance with yet another embodiment, a digital, transparent latch comprises multiple clock input ports adapted to receive a plurality of clock signals, a scan input port coupled to one of the clock input ports and adapted to receive scan data signals, data input ports coupled to another one of the clock input ports and adapted to receive functional data signals, and an enable signal port coupled to the another one of the clock input ports and adapted to receive an enable signal. The data input port comprises a multiple-input, single-output multiplexer, the multiple inputs comprising the functional data signals and the output selected from the multiple inputs according to a state of the enable signal.

BRIEF DESCRIPTION OF THE DRAWINGS

For a detailed description of exemplary embodiments of the invention, reference will now be made to the accompanying drawings in which:

FIG. 1 shows a system diagram in accordance with embodiments of the invention;

FIG. 3 illustrates the use of dual, non-overlapping scan clocks to avoid hold timing violations;

FIG. 4 shows a preferred embodiment of a clock generator to generate the dual, non-overlapping scan clocks;

FIG. 7 shows a schematic of a negative level latch in accordance with embodiments of the invention;

FIGS. 8A and 8B illustrate the digital storage element's dual behavior in which the master and slave latches are of opposite polarities while in functional mode and of the same polarity while in scan mode;

NOTATION AND NOMENCLATURE

Figure 2:
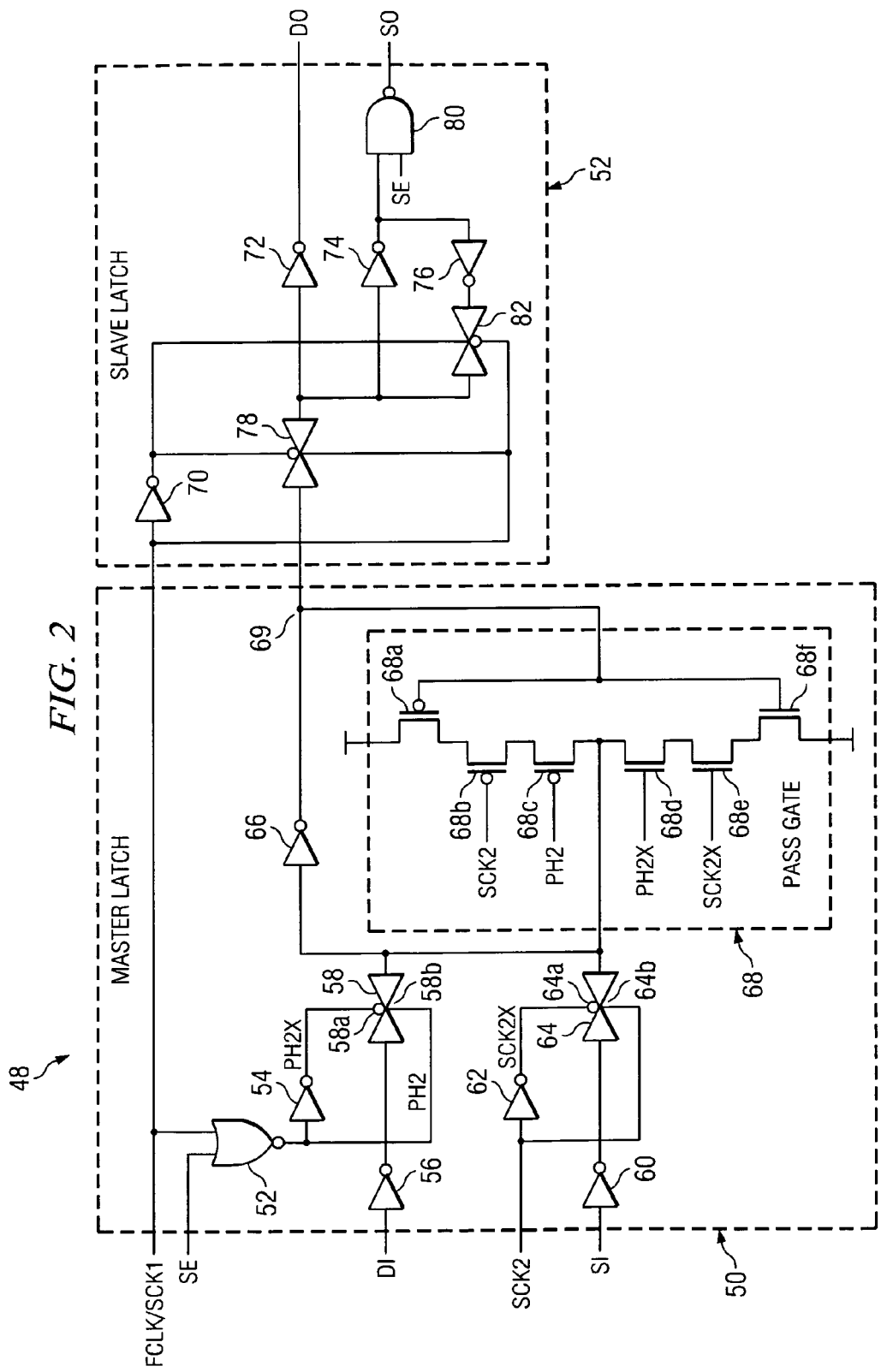
FIG. 2 shows a schematic of a positive edge flip-flop in accordance with embodiments of the invention.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Further, when referring to signals (e.g., enable signals), the terms "high," "1," and "asserted" are interchangeable. Similarly, the terms "low," "0," and "unasserted" also are interchangeable. When referring to transistors or pass gates, the terms "open" and "off" are interchangeable. Similarly, the terms "closed" and "on" are interchangeable. Also, in some cases, an inverter followed by a transmission gate may be considered equivalent to a "tri-state buffer." The term "digital storage element" refers to such elements as a flip-flop and a latch. The term "transmission gate" is interchangeable with the term "pass gate."

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

FIG. 1 shows a preferred embodiment of at least a portion of an integrated circuit (IC) 10. As shown, IC 10 comprises flip-flops 12A, 12B, and 12C and a clock generator 18. The IC 10 comprises other logic labeled as logic 14. The various flip-flops interconnect with the logic 14 as shown. Each flip-flop is "scannable." That is, each flip-flop comprises a data input (DI) and a scan input (SI). The DI input is used for functional data related to the IC's normal mode of operation. When it is desired to test the IC (termed the "scan" or "test" mode), the SI input for each flip-flop is used for test signals instead of the DI input.

Each flip-flop shown in FIG. 1 connects to the logic 14. Flip-flops 12A and 12B also connect to flip-flops 12B and 12C, respectively, to form a "scan chain." The IC 10 may have multiple such scan chains formed therein. The connections from one flip-flop to the next, such as connection 15, are formed for purposes of scan chain testing and generally are not used while the IC is not in the scan mode. A serial test pattern is provided to the IC 10 and clocked through the scan chain (or multiple scan chains) in the IC 10. The test pattern is clocked through the series of flip-flops one clock cycle at a time. The electrical integrity of the various flip-flops can be tested in this fashion by providing test signals to the flip-flops in the scan chain, receiving signals from the flip-flops and comparing the received signals to expected signals.

Whether the flip-flops are in operational mode or scan mode is determined by the state of the scan enable (SE) signal. When the SE signal is low, the IC is not in the scan mode (i.e., when in the IC's normal functional mode), and when SE is high, the IC is in the scan mode. The state of the SE signal causes each flip-flop to use the appropriate input signal (DI or SI).

The clock generator 18 receives a system clock and produces at least two output clocks. One output clock signal provides two different multiplexed clocks labeled as functional clock and scan clock 1 (FCLK/SCK1). The FCLK/SCK1 clock functions as the flip-flop's clock while the IC 10 or at least one of the flip-flops 12A-C is in a functional mode. While the IC 10 is in a scan mode, the FCLK/SCK1 clock functions as one of a pair of scan clocks. The other member of the scan clock pair is the SCK2 clock also provided by the clock generator 18. The SE enable signal is also provided to the clock generator for purposes as described below.

FIG. 2 shows a flip-flop 48 in accordance with an embodiment of the invention. The flip-flop depicted in FIG. 2 comprises a positive edge flip-flop architecture meaning that input data is latched by the flip-flop on a rising clock edge. The flip-flop 48 comprises a master latch 50 coupled to a slave latch 52. The master latch 50 comprises a NOR gate 52, inverters 54, 56, 60, 62 and 66, and pass gates 58, 64, and 68. The slave latch 52 comprises inverters 70, 72, 74, and 76, pass gates 78 and 82, and NAND gate 80.

The master latch 50 receives the FCLK/SCK1 and SCK2 clocks, as well as the SE, DI and SI input signals. The DO and SO output signals are provided as outputs of the slave latch. The NOR gate 52 receives the FCLK/SCK1 and SE signals as inputs and provides its output to inverter 54. The outputs of NOR gate 52 and inverter 54 couple to the enables 58a and 58b of pass gate 58. The DI input is provided through inverter 56 to pass gate 58. The output of pass gate 58 is provided through inverter 66 to the slave latch 52. Pass gate 68 functions as a feedback loop to retain the output at node 69 of the master latch 50 when needed for proper flip-flop operation as explained herein. The SI input is provided through inverter 60 to pass gate 64. The right-hand side outputs of pass gates 58 and 64 couple together and are provided through inverter 66 to slave latch 52. The enables 64a and 64b of pass gate 64 are provided by the SCK2 clock and its inverted form (SCK2X) via inverter 62.

The slave latch 52 receives the output (node 69) of the master latch 50 and provides that signal to the pass gate 78 which is controlled by the FCLK/SCK1 signal and its inverted form (PX1X) via inverter 70. The right-hand side of pass gate 78 couples to inverters 72 and 74 as well as pass gate 82. The output of inverter 74 is fed back through inverter 76 to pass gate 82. The output of inverter 74 is provided as an input to the NAND gate 80 as is the SE signal. The DO and SO output signals are provided by the inverter 72 and NAND gate 80, respectively.

The flip-flop 48 functions as follows. Each latch 50, 52 functions as a transparent latch in which data passes through the latch while the clock is in a first state. When the clock transitions to another state, the output of the latch is retained. In functional mode (i.e., not in scan mode), master latch 50 functions as a negative level sense latch and slave latch 52 functions a positive level sense latch. That is, when the SE signal is low, indicative of functional mode, the pass gate 58 of the master latch 50 permits input signals DI to pass through (i.e., closes) to node 69 as long as the functional clock (FCLK) is low. However, when the FCLK transitions to a high state, the pass gate 58 opens thereby precluding DI from influencing the output of the master latch. When FCLK becomes high and pass gate 58 opens, the feed back pass gate 68, comprising switches 68a-68f configured as shown, closes thereby causing the output at node 69 of the master latch to feedback on itself via inverter 66. Pass gate 68 also inverts the feedback signal. The action of pass gate 68 causes the output of the master latch 50 at 69 to be retained despite changes in DI when the FCLK becomes high.

The slave latch 52 operates in an opposite "polarity" from the master latch 50. Whereas the master latch 50 comprises a negative level latch, the slave latch 52 comprises a positive level latch in functional mode. That is, the slave latch in functional mode is transparent to incoming data at node 69 when FCLK is high. When FCLK is low, pass gate 78 opens thereby permitting the input of the pass gate 78 to pass through to inverter 72 and out the slave latch as the DO output. The DO and SO outputs of the slave latch are retained by the feedback loop formed by inverter 76 and pass gate 82, which is controlled by the FCLK/SCK1 and PH1X signals as shown in FIG. 2.

In functional mode (SE low), the SCK 2 signal is gated off (low) via circuitry external to flip-flop 48. The only active clock signal provided to the flip-flop is the FCLK signal on the signal labeled FCLK/SCK1. With SE low, the flip-flop functions to clock input data (DI) through to the output terminal DO.

In scan mode (SE high), the flip-flop operates using two active clocks—SCK1 (on the FCLK/SCK1 signal) and SCK2. In accordance with preferred embodiments of the invention, the SCK1 and SCK2 clocks are non-overlapping clocks meaning that the two clocks are not both high at the same time and that there is some time during each clock's cycle that both clock signals are low. Exemplary SCK1 and SCK2 clocks are illustrated in FIG. 3. As shown, the SCK1 and SCK2 clocks comprise a series of clock pulses 90 and 92, respectively. While each SCK1 clock pulse 90 is high, the SCK2 clock signal is low, and while each SCK2 clock pulse 92 is high, the SCK1 clock signal is low. A period of time 94 is provided between clock pulses 90 and 92 at which both clock signals are low.

The use of dual, non-overlapping clocks in scan mode advantageously avoids hold violations. A hold violation is a race condition that constitutes a violation of the hold time requirement of a flip-flop or latch. The hold time is the minimum amount of time that a data signal should be held steady after a clock event so that the data is reliably sampled by the clock event. In the case of two, serially-connected flip-flops, the output of the first flip-flop may be coupled to the input of the second flip-flop. The first flip-flop might clock and change its output from the original signal to a new signal before the second flip-flop is able to clock the original signal. In this situation, the second flip-flop will clock the wrong signal, that is, the new signal instead of the original signal. The problem is that the input to the second flip-flop is not held steady long enough to satisfy its hold time requirement. In some IC systems, this hold violation problem is addressed by adding delay logic (e.g., a buffer designed to provide extra time delay) between the first and second flip-flops to prevent the input to the second flip-flop from changing too quickly relative to the requisite amount of hold time.

The preferred embodiment of flip-flop 48, however, avoids the need for such external delay buffers because the flip-flop uses an SCK2 clock pulse to clock the master latch 50 and a later, non-overlapping SCK1 clock pulse to clock the slave latch 52. In this manner, the master latch 50 captures the logic value present on the scan input (SI) port of the master latch before the slave latch 52 has a chance to launch the new input signal present on the node 69. Alternatively stated, the master latch 50 of each flip-flop captures or samples the current SI signal and retains this value on node 69 before the slave latch 52 is allowed to update the DO output.

FIG. 4 shows a preferred embodiment of clock generator 18 from FIG. 1. The clock generator 18 receives the system clock as an input and generates the two scan clocks SCK1 and SCK2, with SCK1 also functioning as FCLK in functional mode. As shown, the clock generator 18 comprises a flip-flop 110, a NAND gate 112, inverters 111 and 114, and a pair of integrated clock gating cells 116, 118. The outputs of the integrated clock gating cells 116 and 118 provide the SCK1 and SCK2 clocks, respectively. The system clock is used to clock flip-flop 110 as well as integrated clock gating cells 116 and 118. The output of flip-flop 110 is provided as one of the inputs of the two-input NAND gate 112. The other NAND gate input is the SE signal which, as explained above, is high when the IC is in scan (test) mode and low when the IC is in functional mode. The output of the NAND gate 112 is provided as an input to integrated clock gating cell 116 and via the inverter 114 to integrated clock gating cell 118.

When the SE signal is low (functional mode), the output of the NAND gate 112 remains high despite the state of the other input from flip-flop 110. With the output of NAND gate 112 being high, only the integrated clock gating cell 116 is active and the system clock is provided through integrated clock gating cell 116 as the FCLK. When the SE signal is high (scan mode), the NAND gate 112 functions logically as an inverter thereby passing the system clock via flip-flop 110 through to the integrated clock gating cell and, via inverter 114, to integrated clock gating cell 118. The system clock is used to clock flip-flop 110. The output of flip-flop 110 is inverted, via inverter 111, and fed back into the flip-flop. The flip-flop's output thus changes state in synchronization with the clock pulses of the system clock. Because integrated clock gating cell 116 receives the NAND gate's output in uninverted form and integrated clock gating cell 118 receives the NAND gate's output in inverted form (via inverter 114), the two integrated clock gating cells are not active at the same time and thus can produce non-overlapping SCK1 and SCK2 clocks as described above. Moreover, the clock generator 18 of the preferred embodiment of FIG. 4 permits the separation of the two scan clocks to be controlled via system clock's clock period and duty cycle. An external tester can be used to optimize the test period to achieve the highest possible test clock frequency. If failures occur, the clock period can be increased until the scan setup or hold violations and their related test failures are eliminated.

Referring again to FIG. 1, the slave latch 52 preferably includes a NAND gate 80. The NAND gate 80 is used to gate off the SO output signal using the SE enable signal. When SE is low (functional mode), the output of the NAND gate 80 is high and remains high. In particular, the SO output will not change logic state despite the activity of the flip-flop 48 in functional mode. As such, the scan chain logic in the IC will consume less power than if the NAND gate 80 were not present.

Figure 5:
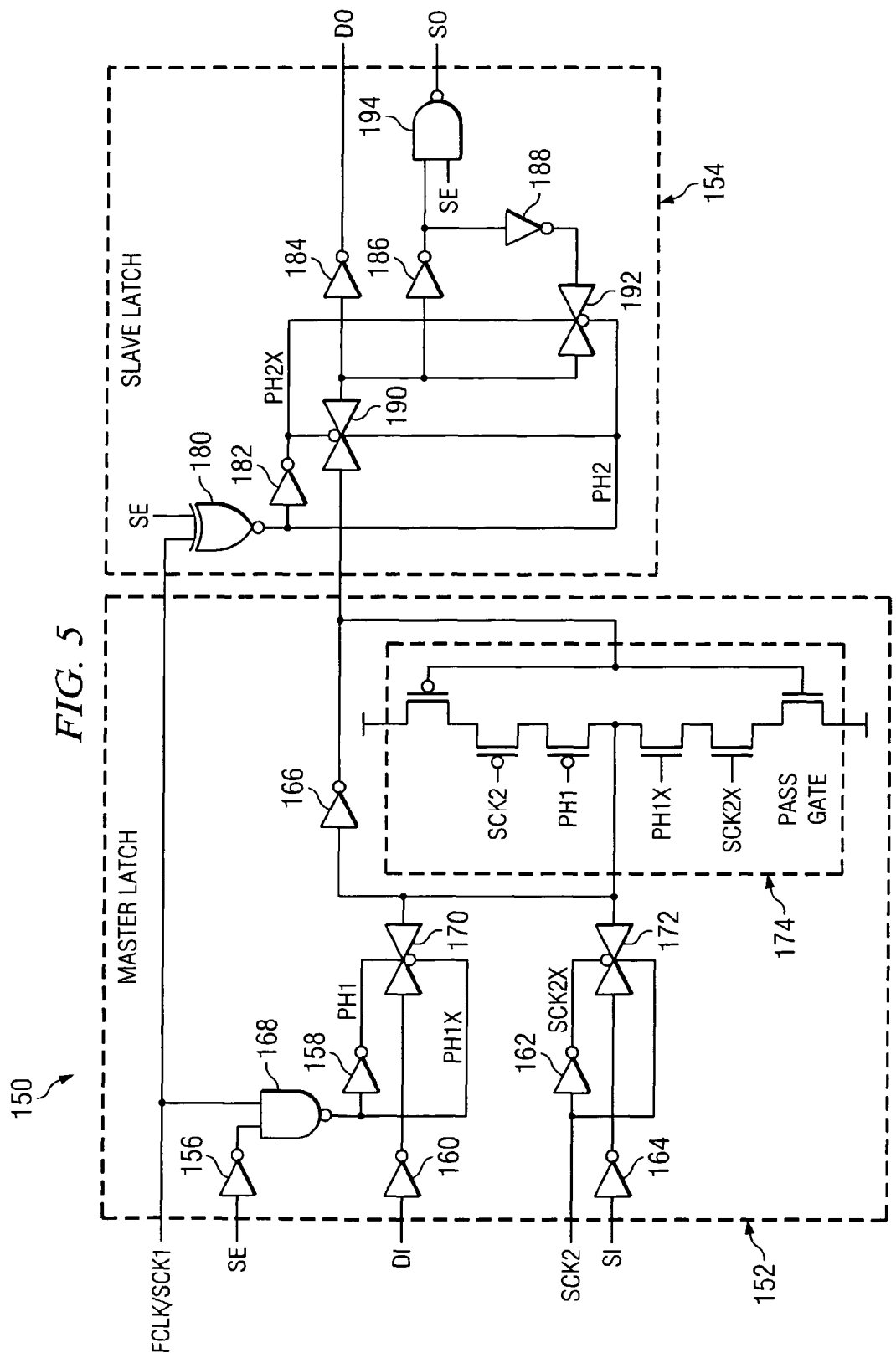
FIG. 5 shows a schematic of a negative edge flip-flop in accordance with embodiments of the invention.

FIG. 5 illustrates an embodiment of a negative edge flip-flop 150 in which input data (DI or SI) is latched onto the output (DO or SO) on a falling edge of the clock. The negative edge flip-flop 150 comprises a master latch 152 and a slave latch 154. In some respects, the negative flip-flop 150 of FIG. 5 operates similar to the positive edge flip-flop 48 of FIG. 2. For instance, the negative edge flip-flop 150 operates from a single clock (FCLK) while in functional mode (SE low), but with dual, non-overlapping scan clocks (SCK1 and SCK2) while in scan mode (SE high). Further, the scan output (SO) is gated off by a NAND gate 194 using the SE signal to save power as explained above.

Referring still to FIG. 5, the master latch 150 comprises inverters 156, 158, 160, 162, 164, and 166, and pass gates 170, 172 and 174. The slave latch 152 comprises an exclusive NOR (XNOR) gate 180, inverters 182, 184, 186, and 188, pass gates 190, 192, and, as mentioned above, NAND gate 194.

In functional mode (with SE low), the NAND gate 168 functions logically as an inverter with respect to the clock input. Thus, when FCLK is low, the output of the NAND gate is high thereby causing pass gate 170 to be open. Accordingly, when FCLK is low, the master latch is not transparent. For the slave latch 154, in functional mode (SE low) the XNOR gate 180 also functions as an inverter for the clock input. Thus, when FCLK is low in functional mode the output of the XNOR gate 180 is high, thereby causing the slave latch 154 to be transparent.

Still assuming functional mode (SE low), when FCLK is high, the master latch's pass gate 170 closes thereby causing the master latch 152 to be transparent. Further, with FCLK high, the slave latch's pass gate 190 opens thereby causing the slave latch 154 not to be transparent.

In scan mode (SE high), the output of the master latch's NAND gate 168 is high and remains high thereby opening pass gate 170 and effectively disabling the data input (DI) port of the flip-flop 150. The SCK2 clock, which becomes active in scan mode, is used to operate the master latch 152. The SCK1 clock is used to operate the slave latch 154. Both the master and slave latches are transparent while the flip-flop is in scan mode and when their respective clocks are high. Both latches are not transparent when their respective clocks are low.

Figure 6:
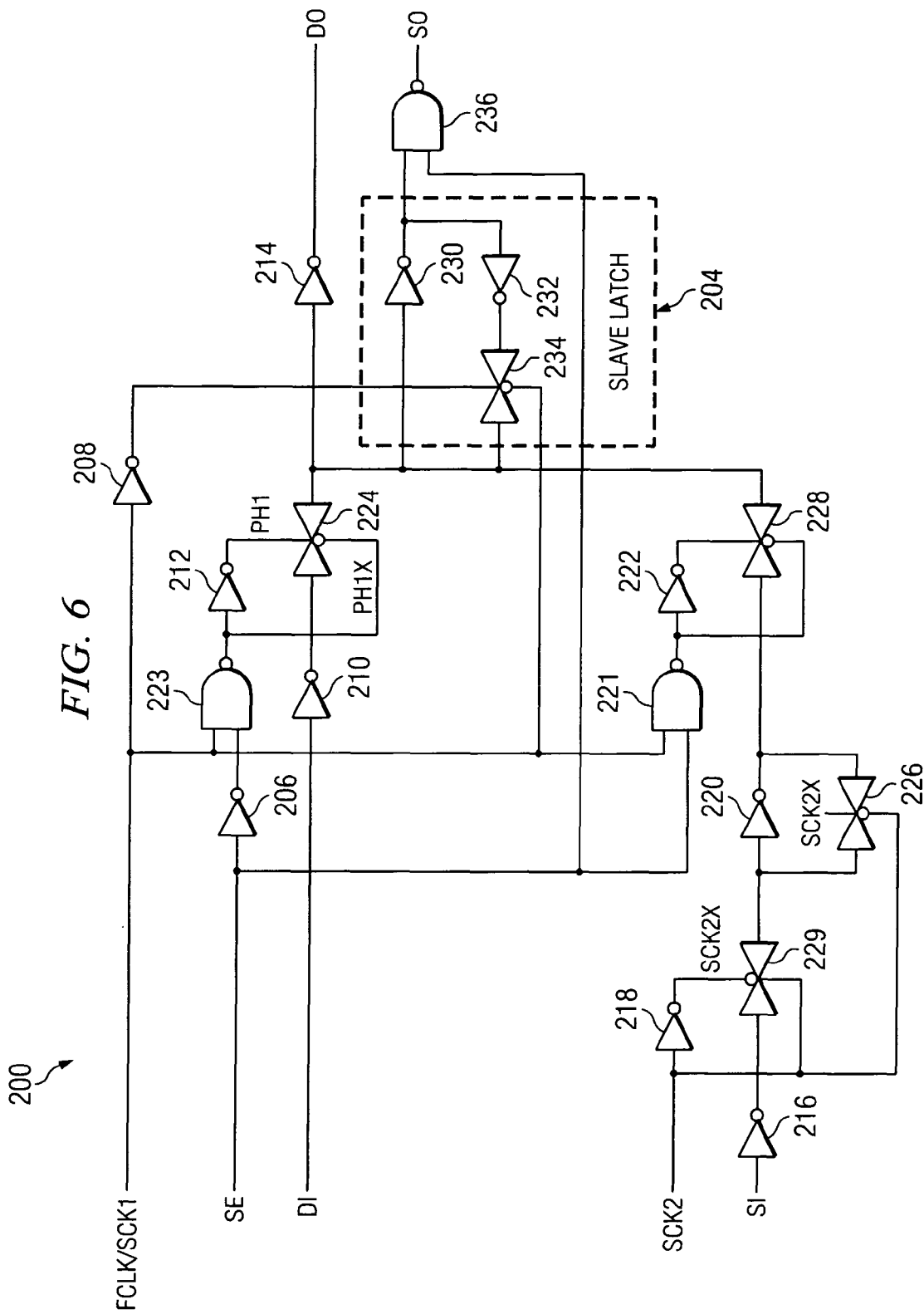
FIG. 6 shows a schematic of a positive level latch in accordance with embodiments of the invention.

FIG. 6 shows an embodiment of a transparent positive level latch 200 that is scannable, observable and controllable. When the clock is high, a positive level latch is transparent. When the clock is low, the latch is not transparent, thus retaining the output. An observable latch is one in which the contents of the latch may be observed by shifting out the contents of the latch during a scan mode shift operation. A controllable latch is one in which the contents of the latch can be set to a desired value during scan-based testing and whose contents can be observed by shifting out the contents via the scan chain in scan mode. The latch 200 of FIG. 6 comprises a master latch and a slave latch 204. The master latch comprises the components not included as part of the slave latch 204. The slave latch is included for scan purposes to be able to observe the output of the master latch 202 while in scan mode.

The master latch in FIG. 6 comprises inverters 206, 208, 210, 212, 214, 216, 218, 220, and 222, pass gates 224, 228, and 229, and NAND gates 221, 223, and 236. While in functional mode (SE low), NAND gate 223 functions as an inverter with respect to the NAND gates' clock input. When FCLK is high in functional mode, the output of the NAND gate is low which closes pass gate 224 thereby causing the master latch to transparently pass the input data (DI) through inverters 210 and 214 to the output (DO). When FCLK goes low in functional mode, the pass gate 224 opens and the last state of DO is retained. In scan mode (SE high), both clocks SCK1 and SCK2, which are non-overlapping clocks, are used to operate the latch. The SCK1 clock is used to operate the slave latch 204, while the SCK2 clock is used to operate the master latch (e.g., pass gate 226 and 229). The SCK2 clock is asserted high before the SCK1 clock is asserted high (see FIG. 3), thereby causing the master latch to capture the scan input data before the slave latch 204 can clock in the new slave latch scan shift data value.

The dual, non-overlapping clocks used in the positive level latch 200 of FIG. 6 avoids hold violation problems as explained above. Further, the output NAND gate 236 causes the scan chain to consume less power than would otherwise be the case.

FIG. 7 shows an embodiment of a transparent negative level latch 250 that is scannable, observable and controllable. A negative level latch is transparent while the clock is low and closes to retain the output when the clock becomes high. The latch 250 of FIG. 7 comprises a master latch and a slave latch 254, with the master latch comprising the components not forming part of the slave latch. The slave latch 254 is included for scan purposes to be able to observe the output of the master latch 252 while in scan mode. The operation of the transparent negative level latch 250 is similar to that discussed above with regard to the positive level latch 200 of FIG. 6. The polarity of the master latch of FIG. 7 is opposite to that of the master latch of FIG. 6 (i.e., in functional mode, the master latch of FIG. 7 is transparent when FCLK is high).

In accordance with the embodiments of the positive and negative edge flip-flops 48 and 150 discussed above and shown in FIGS. 2 and 5, the flip-flops re-configure themselves based on the operational mode, scan mode versus functional mode. In functional mode (SE low), the master and slave latches operate in opposite polarities. This behavior is illustrated in FIG. 8A. As shown, the master latch has polarity X, while slave latch as polarity Y. For the positive edge flip-flop 48 of FIG. 2, polarity X for the master latch in functional mode comprises the master latch being transparent when FCLK is low (negative level sense latch behavior) and polarity Y for the slave latch comprises the slave latch pass gate being open when the FCLK is low and thus transparent when FCLK is high (positive level sense latch behavior). The opposite is true for the negative edge flip-flop 150 of FIG. 5. In that embodiment, polarity X for the master latch comprises the master latch being transparent when FCLK is high and polarity Y for the slave latch comprises the slave latch being transparent when FCLK is low. Moreover, in functional mode the master and slave latches operate in opposite polarities.

Because the master and slave latches are of opposite polarities, a problem occurs when attempting to connect a positive edge flip-flop to a negative edge flip-flop. In that scenario, the positive flip-flop's slave latch will be of the same polarity as the master latch of the negative edge flip-flop. Thus, two transparent latches of the same polarity will be connected serially together and race conditions leading to hold violations may occur. A solution to this problem is to include an external "lockup" latch of the opposite polarity between the positive edge and negative edge flip-flops. For example, if the slave latch of a positive edge flip-flop is of polarity X and a connection is desired to a master latch of a negative edge flip-flop that also is of polarity X, a polarity Y lockup latch is inserted therebetween to solve the aforementioned problem.

In scan mode, however, the master and slave latches are of the same polarity as illustrated in FIG. 8B (both latches have polarity X). In accordance with the preferred embodiments of the invention, polarity X for both positive and negative level flip-flops 48 and 150 comprises both the master and slave latches being positive level sense transparent latches. In other embodiments, however, the master and slave latches could both be implemented as negative level sense latches. With both of the master and slave latches being of the same polarity for both types of flip-flops (positive and negative level flip-flops), when using non-overlapping scan clocks, an external lockup latch is not needed on the scan shift data path (i.e., SI, SO), thereby saving space, cost, etc. Moreover, while lockup latches may be needed for the functional data paths, lockup latches are not needed for the scan chain.

In some embodiments, the flip-flops 48, 150 described above may be modified to comprise additional circuitry that enables the flip-flops 48, 150 to be reset and/or preset. Flip-flops may need to be reset or preset when, for instance, the IC 10 is started up and the flip-flops in the IC 10 are to be cleared of any pre-existing values stored in the flip-flops. Flip-flops generally are reset or preset in functional mode. When a flip-flop is reset, the state of the flip-flop is set to low. When a flip-flop is preset, the state of the flip-flop is set to high. Reset and preset functionality may be implemented in various embodiments of both flip-flops 48, 150, at least some of which are now discussed in turn.

Figure 9:
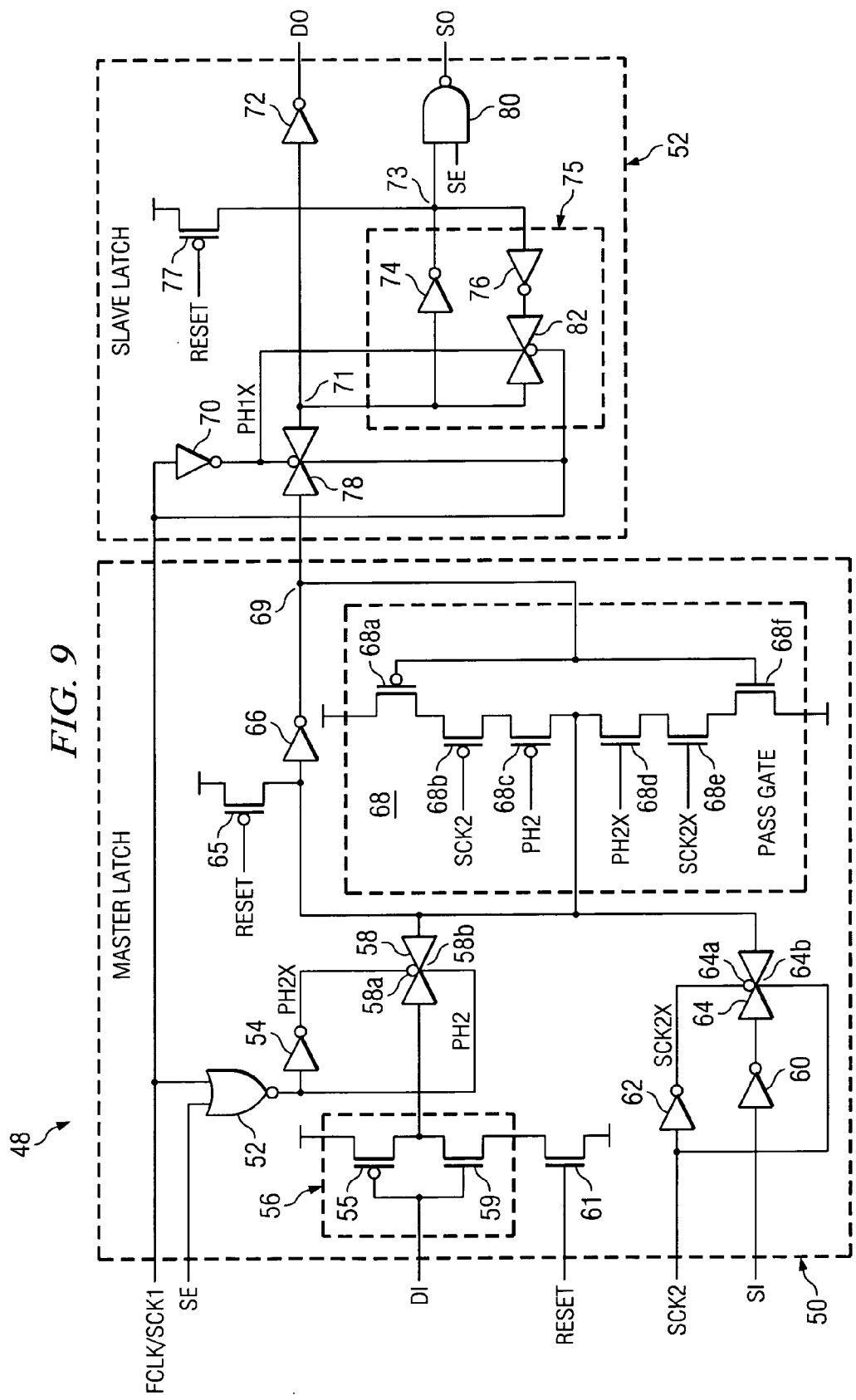
FIG. 9 shows a schematic of a positive edge flip-flop with asynchronous reset capability in accordance with embodiments of the invention.

FIG. 9 shows a modified version of the flip-flop 48 of FIG. 2 in that the flip-flop 48 of FIG. 9 is modified to comprise reset functionality. The flip-flop 48 of FIG. 9 is similar to that of FIG. 2, with the exception of three additional transistors 57, 65, 77. The transistor 77 is coupled to the output of inverter 74 and is thus an input to the NAND gate 80. The transistor 77 preferably is a PMOS transistor that is coupled to a voltage source (not specifically shown). When a low (i.e., "0") signal is applied to the input of the transistor 77, the transistor 77 closes and provides voltage from the voltage source to the input of the NAND gate 80. When a high (i.e., "1") signal is applied to the input of the transistor 77, the transistor 77 opens and does not conduct an amount of electricity significant enough to affect the operation of the rest of the flip-flop 48. Thus, transistor 77 may be recognized as an "active-low" transistor.

One end of transistor 65, which preferably is a PMOS transistor, is coupled to the input of inverter 66. The other end is coupled to the aforementioned voltage source. When a low signal is applied to the input of the transistor 65, the transistor 65 turns on and provides voltage from the voltage source to the input of the inverter 66. When a high signal is applied to the input of the transistor 65, the transistor 65 opens and does not conduct an amount of electricity significant enough to affect the operation of the rest of the flip-flop 48. Thus, transistor 65 also may be recognized as an "active-low" transistor.

Transistor 61, preferably an NMOS transistor, is coupled to an NMOS transistor 59, which NMOS transistor 59 is in turn coupled to a PMOS transistor 55. The transistors 55, 59 together comprise the inverter 56 of FIG. 2. The transistor 55 is coupled to the aforementioned voltage source, and transistor 61 is coupled to ground. The transistor 55 is an active-low transistor, whereas the transistors 59, 61 are active-high transistors. That is, the transistors 59, 61 close when a high input is applied to each transistor, and the transistors 59, 61 open when a low input is applied to each transistor. Because the transistors 55, 59 together comprise the inverter 65 of FIG. 2, the transistors 55, 59 each receive an input signal that is the same as the input to the inverter 56 (i.e., the "DI" signal).

The transistors 61, 65, 77 each receive an input signal "RESET." The RESET signal is low when the status of the flip-flop 48 is to be reset. The RESET signal is high when the status of the flip-flop 48 is not to be reset. The state of the flip-flop 48 generally is dictated by the state of the slave latch 52. For example, when the status of the slave latch 52 is low, the status of the flip-flop 48 is considered to be low. Likewise, when the status of the slave latch 52 is high, the status of the flip-flop 48 is considered to be high. Thus, the transistors 61, 65, 77 are implemented in the flip-flop 48 such that, when the RESET signal is low, the status of the slave latch 52 is driven low. In this way, the status of the flip-flop 48 also is driven low, thus resetting the flip-flop 48.

The reset functionality implemented in the flip-flop 48 is known as "asynchronous," because the reset functionality is not synchronous with any clock provided to the flip-flop 48. That is, the reset functionality may be used regardless of the state of any of the clocks FCLK/SCK1, SCK2 because the reset functionality is independent of the status of these clocks. Asynchronous reset functionality is made possible in the flip-flop 48 with the implementation of the transistors 65, 77. When the FCLK/SCK1 signal is low, the transistor 77 is used to reset the status of the slave latch 52, thus resetting the flip-flop 48. When the FCLK/SCK1 signal is high, the transistor 77 cannot be used to reset the status of the slave latch 52, for reasons described further below. Accordingly, when the FCLK/SCK1 signal is high, the transistor 65 is used to reset the status of the slave latch 52, thus resetting the flip-flop 48.

More specifically, when the FCLK/SCK1 signal is low, the status of the slave latch 52 (and thus the flip-flop 48) is reset by the transistor 77. A low FCLK/SCK1 signal causes the pass gate 78 to open, thus isolating the status of the slave latch 52 from the master latch 50. To reset the status of the slave latch 52, the status of node 71 must be reset (i.e., to "0"). To reset node 71, a low RESET signal is applied to the input of the transistor 77. Applying a low RESET signal to the transistor 77 causes the transistor 77 to turn on, thus supplying voltage from the voltage source to node 73. Thus, the status of node 73 is "pulled high" (i.e., to a "1"). Because the FCLK/SCK1 signal is low, the pass gate 82 is closed. The high signal at node 73 is inverted by inverter 76 to a low signal, which low signal passes through the pass gate 82 and to the node 71, thereby resetting the status of the slave latch 52 (and the flip-flop 48). The low state of the node 71 is maintained by the feedback loop 75, wherein the low state is inverted by the inverter 74 into a high state, which high state is again inverted by inverter 76 to a low state. In this way, the transistor 77 is used to reset the status of the slave latch 52, and the reset status of the slave latch 52 is maintained by the feedback loop 75. Thus, the flip-flop 48 is reset.

The above process may be used to reset the flip-flop 48 when the FCLK/SCK1 signal is low. However, when the FCLK/SCK1 signal is high, the transistor 77 cannot be used to reset the status of the slave latch 52 (and thus the flip-flop 48). This is because when the FCLK/SCK1 signal is high, the pass gate 82 is open. Thus, while the transistor 77 may pull high the node 73, no voltage passes by the pass gate 82, and so the node 71 cannot be set to "0." For this reason, the flip-flop 48 cannot be reset using the transistor 77 when the FCLK/SCK1 signal is high. Thus, in such a case, the transistor 65 may be used to reset the flip-flop 48. To reset node 71 of the slave latch 52, a low RESET signal is applied to the input of the transistor 65. This causes the transistor 65 to turn on and pass voltage from the voltage source to the inverter 66. Because the input to the inverter 66 is high, the voltage of the node 69 is low. When the FCLK/SCK1 signal is high, the pass gate 78 closes. Thus, the low signal at node 69 passes through the pass gate 78 and to the node 71. In this way, the status of the slave latch 52 is reset, thereby resetting the flip-flop 48. The status of node 71, as set by the transistor 65, is not molested by transistor 77 because the pass gate 82 is off.

In some cases, a problem may arise when using transistor 77 to reset the flip-flop 48. As previously mentioned, the transistor 77 preferably is used when the FCLK/SCK1 signal is high. When the FCLK/SCK1 signal is high, the pass gate 58 closes. Further, the RESET signal applied to the input of the transistor 77 is the same signal that is applied to the transistor 65. Thus, transistor 65 closes and pulls high the input to the inverter 66. This high voltage passes through the pass gate 58, which is closed, to the inverter 56. In the case that the data input DI to the inverter 56 is high, the PMOS transistor 55 is off and the NMOS transistor 59 is on. The NMOS of the inverter 56 in FIG. 2, although not explicitly shown in FIG. 2, is directly coupled to ground. In this case, there is a short circuit coupling the voltage source of transistor 65 directly to the ground coupled to the NMOS of the inverter 56. To prevent this short circuit problem, the flip-flop 48 comprises the NMOS transistor 61 between the transistor 59 and ground. The input to this transistor 61 is the RESET signal. Thus, when the RESET signal is low and the transistor 65 is on, the transistor 61 is off. In this way, the transistor 61 prevents a short circuit between ground and the voltage source of transistor 65 when the RESET signal is low. When the RESET signal is high, the transistor 65 is off, and thus there is no risk for short circuit. In this case, the transistor 61 is on and couples ground to the inverter 56.

Figure 10:
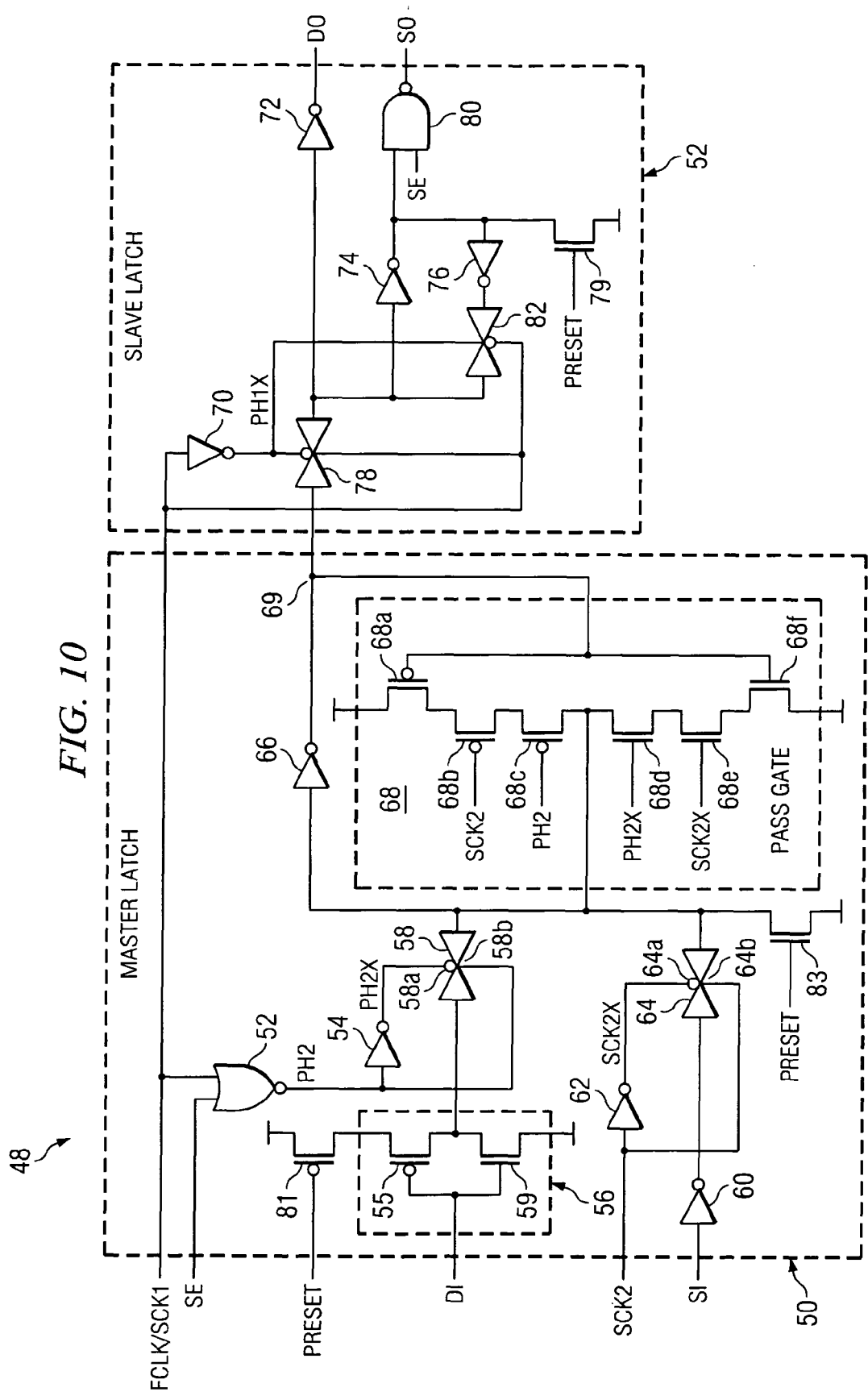
FIG. 10 shows a schematic of a positive edge flip-flop with asynchronous preset capability in accordance with embodiments of the invention.

An asynchronous preset functionality may be implemented in the flip-flop 48 of FIG. 2 in a manner similar to the flip-flop 48 of FIG. 9, as shown in FIG. 10. Referring to FIGS. 9 and 10, the PMOS transistor 77 of FIG. 9 is replaced with NMOS transistor 79 of FIG. 10. One end of the NMOS transistor 79 preferably is coupled to ground, while the other end of the transistor 79 is coupled to the input of inverter 76. The input to the transistor 79 is a signal PRESET. When the signal PRESET is high, the transistor 79 is on. When the signal PRESET is low, the transistor 79 is off. Thus, transistor 79 is an active-high transistor. In the case where the clock signal FCLK/SCK1 is low, the transistor 79 is used to preset (i.e., set to "1") the slave latch 52, thereby presetting the flip-flop 48. Specifically, when the FCLK/SCK1 signal is low, the pass gate 78 is open, while the pass gate 82 is closed. If the PRESET signal is high, the input to the inverter 76 is pulled down toward ground, thereby generating a high output signal at the inverter 76. The high signal is passed through the pass gate 82 and to node 71. Because the status of node 71 is high, the slave latch 52 is preset. Because the slave latch 52 is preset, the flip-flop 48 is preset.

The PMOS transistor 65 of FIG. 9 is replaced by NMOS transistor 83 in FIG. 10. When the clock signal FCLK/SCK1 is high, the transistor 83 is used to preset the flip-flop 48 (by presetting the slave latch 52). Specifically, when the FCLK/SCK1 signal is high, the pass gate 58 opens, the pass gate 78 closes, and the pass gate 82 opens. Because the pass gate 82 opens, the transistor 79 cannot be used to preset the slave latch 52. For this reason, transistor 83 is used to preset the slave latch 52. One end of the transistor 83 is coupled to ground, while the other end of the transistor 83 is coupled to the input of the inverter 66. The input to the transistor 83 is the PRESET signal. When the PRESET signal is low, the transistor 83 is off. When the PRESET signal is high, the transistor 83 is closed. To preset the slave latch 52, the status of node 71 must be driven "high." To drive node 71 high, the output of the inverter 66 must be made high, since the pass gate 78 is on. To make the output of the inverter 66 high, the input to the inverter 66, which input is coupled to the transistor 83, must be made low. To make the input to the inverter 66 low, the transistor is simply turned on by applying a high PRESET signal to the input of the transistor 83. In this way, the ground connection to the transistor 83 pulls down the input to the inverter 66, thereby causing the voltage at node 71 to be driven high. In this way, the slave latch 52 and the flip-flop 48 are preset.

The PMOS transistor 81 is coupled to the inverter 56. Like the NMOS transistor 61, the transistor 81 protects the flip-flop 48 from short circuits. Specifically, when the signal FCLK/SCK1 is low, the pass gate 58 closes. If the PRESET signal is high, the transistor 83 is on, thereby directly coupling ground to the inverter 56. If the input DI to the inverter 56 is low, then the PMOS transistor 55 is turned on. Were it not for the active-low PMOS transistor 81 between the transistor 55 and a voltage source, a short circuit would exist between the ground coupled to transistor 83 and the voltage source coupled to the inverter 56. However, the transistor 81 prevents such a short circuit. When the PRESET signal is high, the transistor 81 turns off. Thus, while a high PRESET signal may activate the transistor 83, the transistor 81 is deactivated, thus eliminating the risk of a short circuit.

Figure 11:
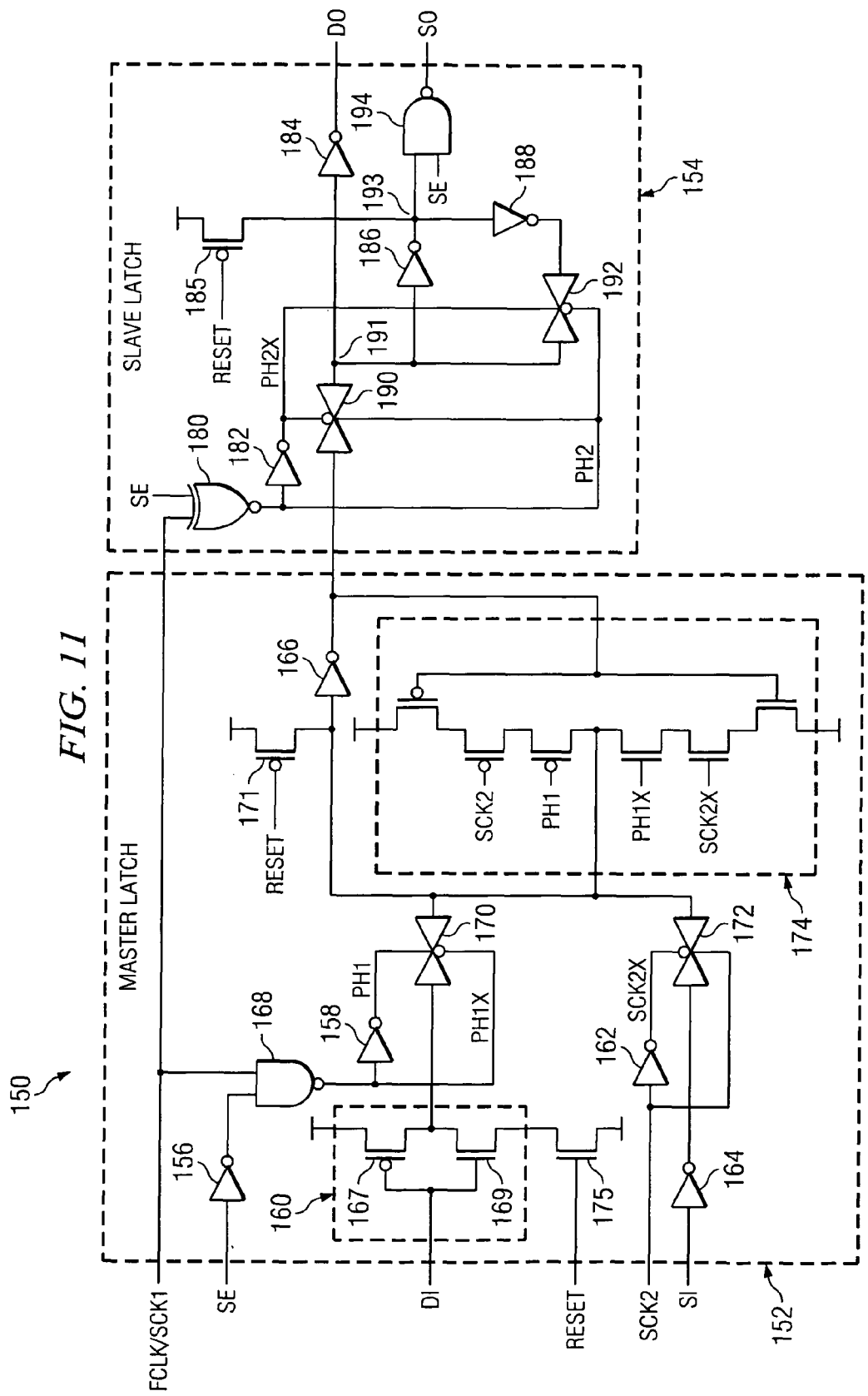
FIG. 11 shows a schematic of a negative edge flip-flop with asynchronous reset capability in accordance with embodiments of the invention.

Asynchronous reset and preset functionality also may be implemented in the flip-flop 150 of FIG. 5. Shown in FIG. 11 is a flip-flop 150 similar to that of FIG. 5. Additional circuitry is used in the flip-flop 150 of FIG. 11 to implement a reset functionality. In comparison to the flip-flop 150 of FIG. 5, the flip-flop 150 of FIG. 11 contains three additional transistors 171, 175, 185. Like the flip-flop 48 of FIG. 9, this flip-flop 150 uses these transistors 171, 175, 185 to reset the state of the slave latch 154, thus resetting the flip-flop 150. In the case that the FCLK/SCK1 signal is high, the output of the XNOR gate 180 is low. This is because the FCLK/SCK1 input to the XNOR gate 180 is high and the other input, SE, is low (i.e., the flip-flop 150 is in functional mode). The low output of the XNOR gate 180 is inverted by inverter 182 to produce a high signal, which high signal opens the pass gate 190 and closes pass gate 192. Because pass gate 192 is closed, the transistor 185 may be used to set the status of node 191 to low, thus resetting the slave latch 154 and the flip-flop 150. Specifically, to reset the flip-flop 150, a low RESET signal is applied to the input of PMOS transistor 185, thus turning on the transistor 185. One end of the transistor 185 is coupled to a voltage source (not specifically shown) and the other end is coupled to node 193, so turning on the transistor 185 provides voltage from the voltage source to the node 193. In this way, the node 193 is set high. The high status of node 193 is inverted by inverter 188 to a low signal, which low signal passes through the pass gate 192 and to the node 191. Thus, because a low signal is applied to the node 191, the slave latch 154 is reset. Because the slave latch 154 is reset, the flip-flop 150 is reset.

When the signal FCLK/SCK1 is low, the output of the XNOR gate 180 is a high, since the flip-flop 150 is in functional mode. The high signal is inverted by inverter 182, thus closing the pass gate 190 and opening the pass gate 192. Similarly, when the FCLK/SCK1 signal is low, the pass gate 170 is opened. In this case, the transistor 185 cannot be used to drive node 191 low, since pass gate 192 is open. Transistor 171 is used instead. The transistor 171 preferably is a PMOS transistor, which transistor has one end coupled to a voltage source and another end coupled to the input of inverter 166. When a low RESET signal is applied to the input of the transistor 171, the transistor 171 turns on and provides a high signal to the input of the inverter 166, which inverter 166 outputs a low signal. Because the pass gate 190 is closed, the low signal passes through the pass gate 190 and drives the node 191 to a low state. In this way, the slave latch 154 is reset, and thus the flip-flop 150 is reset.

When the FCLK/SCK1 signal is high, the pass gate 170 is closed, the pass gate 190 is open, and the pass gate 192 is closed. Although the transistor 185 is used to reset the flip-flop 150 when the FCLK/SCK1 signal is high, applying a low RESET signal to the input of the transistor 185 also causes a low RESET signal to be applied to the input of the transistor 171, thus turning on the transistor 171. Because transistor 171 is on, and because pass gate 170 is closed, current may flow directly from the voltage source coupled to the transistor 171 to the inverter 160. The inverter 160 is composed of PMOS transistor 167 and NMOS transistor 169. If the DI input to the inverter 160 is high, then the NMOS transistor 169 turns on. Without the presence of the transistor 175, the NMOS transistor 169 would be directly coupled to ground, thus causing a short circuit between the ground coupled to the NMOS transistor 169, and the voltage source coupled to the transistor 171. However, the presence of the transistor 175 prevents this short circuit. Specifically, transistor 171 is on when a low RESET signal is applied thereto. If the RESET signal is low, then the signal applied to the input of the transistor 175 is low, thus turning off the transistor 175 and preventing a short circuit from occurring.

Figure 12:
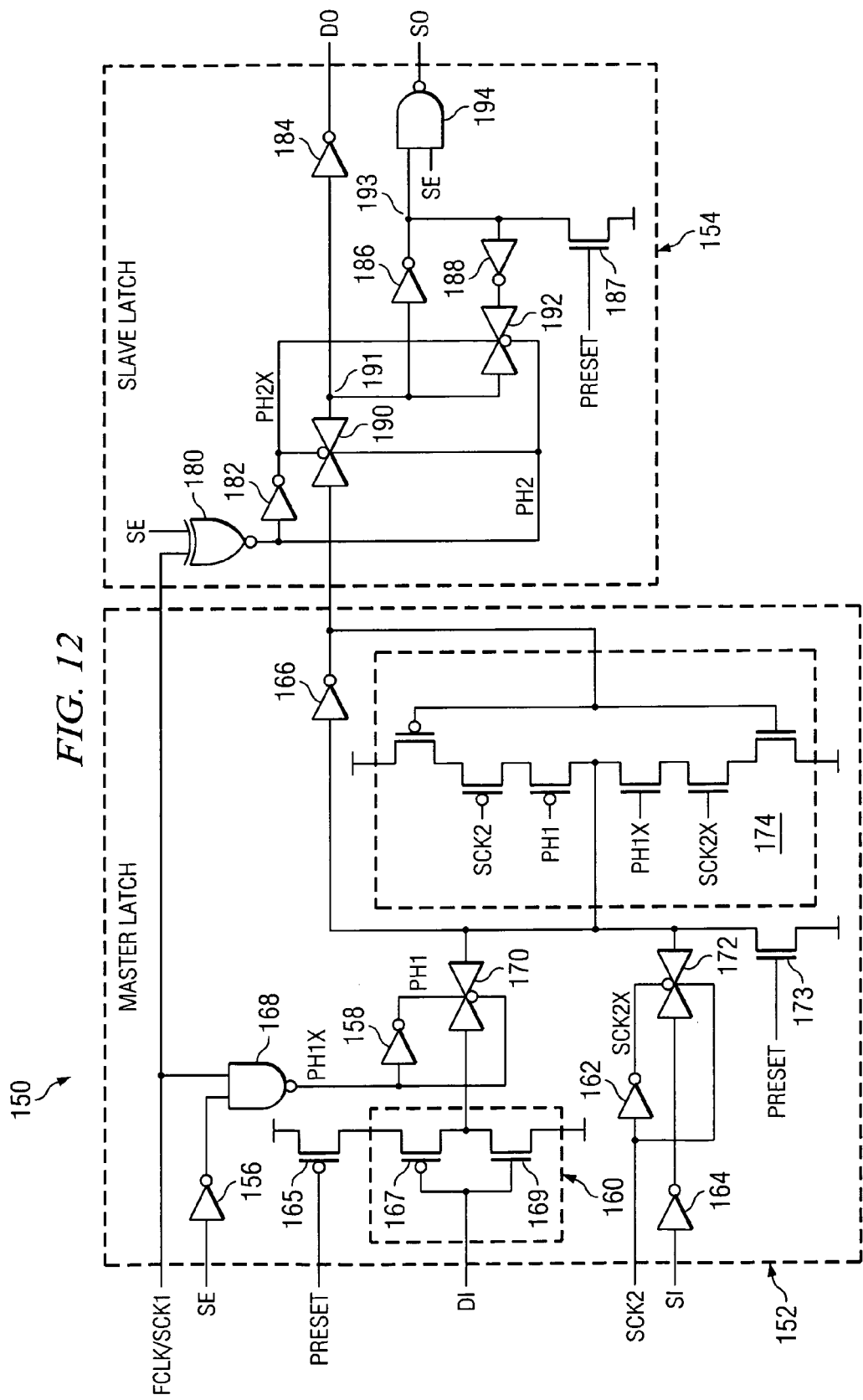
FIG. 12 shows a schematic of a negative edge flip-flop with asynchronous preset capability in accordance with embodiments of the invention.

An asynchronous preset functionality may be implemented in the flip-flop 150 in a manner similar to that with which the reset functionality is implemented. FIG. 12 shows a flip-flop 150 comprising the preset functionality. The circuit logic of the flip-flop 150 of FIG. 12 is substantially similar to the logic of the flip-flop 150 of FIG. 11. However, the transistors 171, 175, 185 of FIG. 11 are replaced with the transistors 173, 165, 187, respectively, in FIG. 12. In a case where the FCLK/SCK1 signal is high, the pass gate 190 is open and the pass gate 192 is closed. Because the pass gate 192 is closed, the NMOS transistor 187 may be used to drive node 191 high, thus presetting the slave latch 154 (and the flip-flop 150). Specifically, one end of the transistor 187 is coupled to ground, while the other end is coupled to node 193. When a high PRESET signal is applied to the input of the transistor 187, the transistor 187 turns on and pulls node 193 down to low. The inverter 188 inverts the low signal of node 193 to a high signal, which high signal passes through the pass gate 192 to the node 191, thus presetting the slave latch 154 and the flip-flop 150.

In the case that the FCLK/SCK1 signal is low, the pass gate 190 is closed and the pass gate 192 is open. Because the pass gate 192 is open, the transistor 187 cannot be used to preset the flip-flop 150. Accordingly, the PMOS transistor 173 is used instead. One end of the transistor 173 is coupled to ground, and the other end is coupled to the input of the inverter 166. When a high PRESET signal is applied to the input of the transistor 173, the transistor 173 turns on and provides a low signal to the inverter 166. The inverter 166 produces a high signal, which high signal passes through the pass gate 190 and to the node 191. In this way, the slave latch 154 and the flip-flop 150 are preset.

The PMOS transistor 165 is inserted between a voltage source and the inverter 160 to prevent short circuit situations like those described above. Specifically, when the FCLK/SCK1 signal is high, the pass gate 170 is closed, the pass gate 190 is open, and the pass gate 192 is closed. Although the transistor 187 is used to preset the flip-flop 150 when the FCLK/SCK1 signal is high, a high PRESET signal is applied to the transistor 187 so that the transistor 187 is turned on. This same high PRESET signal also is applied to the input of transistor 173, thus turning on the transistor 173, even though the transistor 173 is not being used to preset the flip-flop 150. Since the pass gate 170 is closed, were it not for the presence of the PMOS transistor 165 between the voltage source and the inverter 160, a short circuit would be present between the voltage source and the ground coupled to the transistor 173. However, because a high PRESET signal must be applied to transistor 173 to turn on transistor 173, and further because a low PRESET signal must be applied to transistor 165 to turn on transistor 165, transistors 165 and 173 cannot both be on at the same time. Thus, when transistor 173 is on, the transistor 165 is off and prevents a short circuit from occurring.

Figure 13:
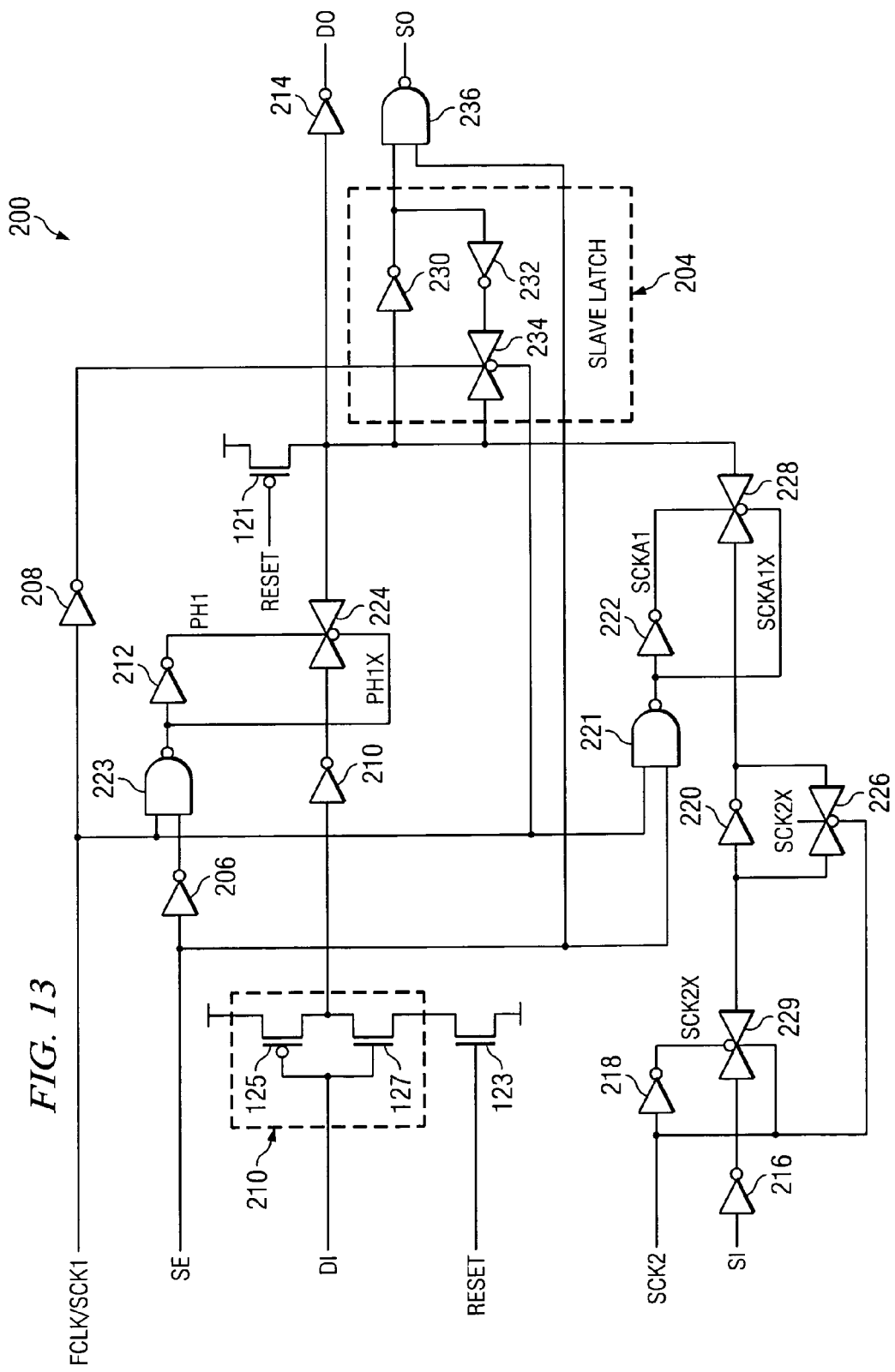
FIG. 13 shows a schematic of a positive level latch with asynchronous reset capability in accordance with embodiments of the invention.

Asynchronous reset and preset functionality also may be implemented in the latches 200, 250 of FIGS. 6 and 7. Referring to FIG. 13, latch 200 is similar to the latch 200 of FIG. 6, with the addition of PMOS transistor 121 and NMOS transistor 123. The transistor 121 may be used to reset the output DO of the latch 200 regardless of the state of the clock signal FCLK/SCK1. One end of the transistor 121 is coupled to a voltage source, while the other end is coupled to the input to the inverter 214. To reset the output of the latch 200, the input to the transistor 121 is provided with a low RESET signal, which causes the transistor 121 to turn on. Because the transistor 121 is turned on, current (i.e., a high signal) flows from the voltage source to the input of the inverter 214, which inverter 214 converts the high signal to a low signal at the output DO of the latch 200. Thus, the latch 200 is reset.

Although the transistor 121 may be used to reset the latch 200 regardless of the status of the clock signal RCLK/SCK1, when the signal RCLK/SCK1 is high, the pass gate 224 closes. If the input to the inverter 210 (i.e., comprising transistors 125, 127) is asserted, then the transistor 127 turns on, thus providing a clear path from the voltage source coupled to the transistor 121, to the transistor 123 coupled to the inverter 210. One end of the transistor 123 is coupled to ground, whereas the other end of the transistor 123 is coupled to the inverter 210. The input to the NMOS transistor 123 is the signal RESET. If the transistor 123 were absent, a short circuit would occur between the ground of transistor 123 and the voltage source of transistor 121. However, both transistors 121, 123 are turned on or off depending on the status of the RESET signal. Transistor 121 turns on when the RESET signal is low, and transistor 121 turns on when the RESET signal is high. Thus, when the transistor 121 is on, transistor 123 is off, thus preventing the short circuit from occurring.

Figure 14:
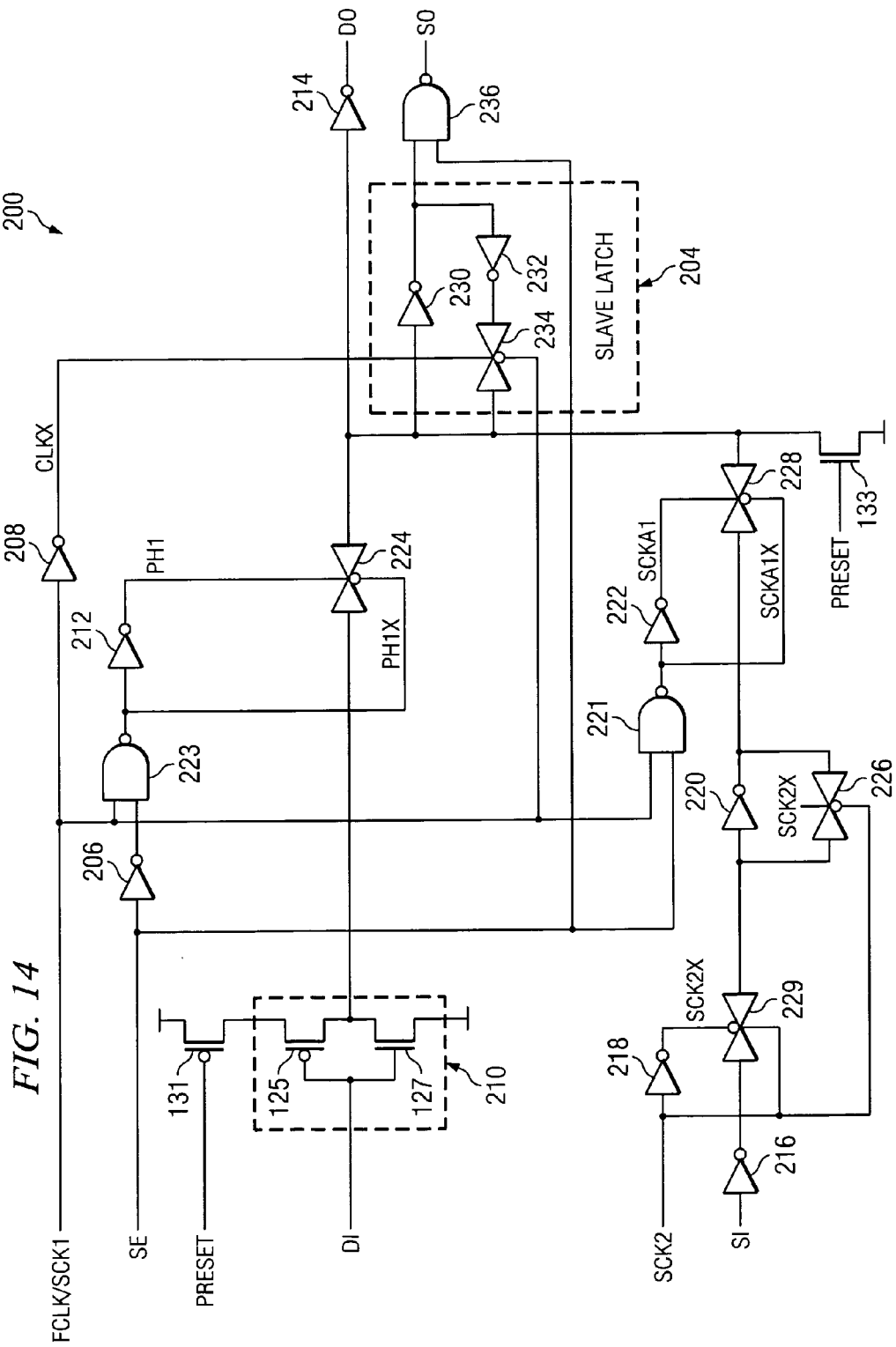
FIG. 14 shows a schematic of a positive level latch with asynchronous preset capability in accordance with embodiments of the invention.

Preset functionality is implemented in the latch 200 as shown in FIG. 14. The circuit configuration of the latch 200 in FIG. 14 is similar to that of the latch 200 of FIG. 13, except that the transistor 121 is replaced with NMOS transistor 133, and transistor 123 is replaced with PMOS transistor 131. Regardless of the status of the clock signal RCLK/SCK1, the latch 200 of FIG. 14 may be preset by establishing a high output DO. One end of the transistor 133 is coupled to ground, while the other end is coupled to the input of the inverter 214. The input to the transistor 133 is the signal PRESET. When the signal PRESET is high, the transistor 133 turns on and provides a low signal to the input of the inverter 214, which inverter 214 inverts the low signal to produce a high signal at the output DO. Thus, the latch 200 is preset. The short circuit problems previously described are prevented in this latch 200 by transistor 131. Specifically, when the clock signal RCLK/SCK1 is high, the PMOS transistor 131 prevents a short circuit from occurring between the voltage source coupled to the transistor 131, and the ground coupled to the transistor 133.

Figure 15:
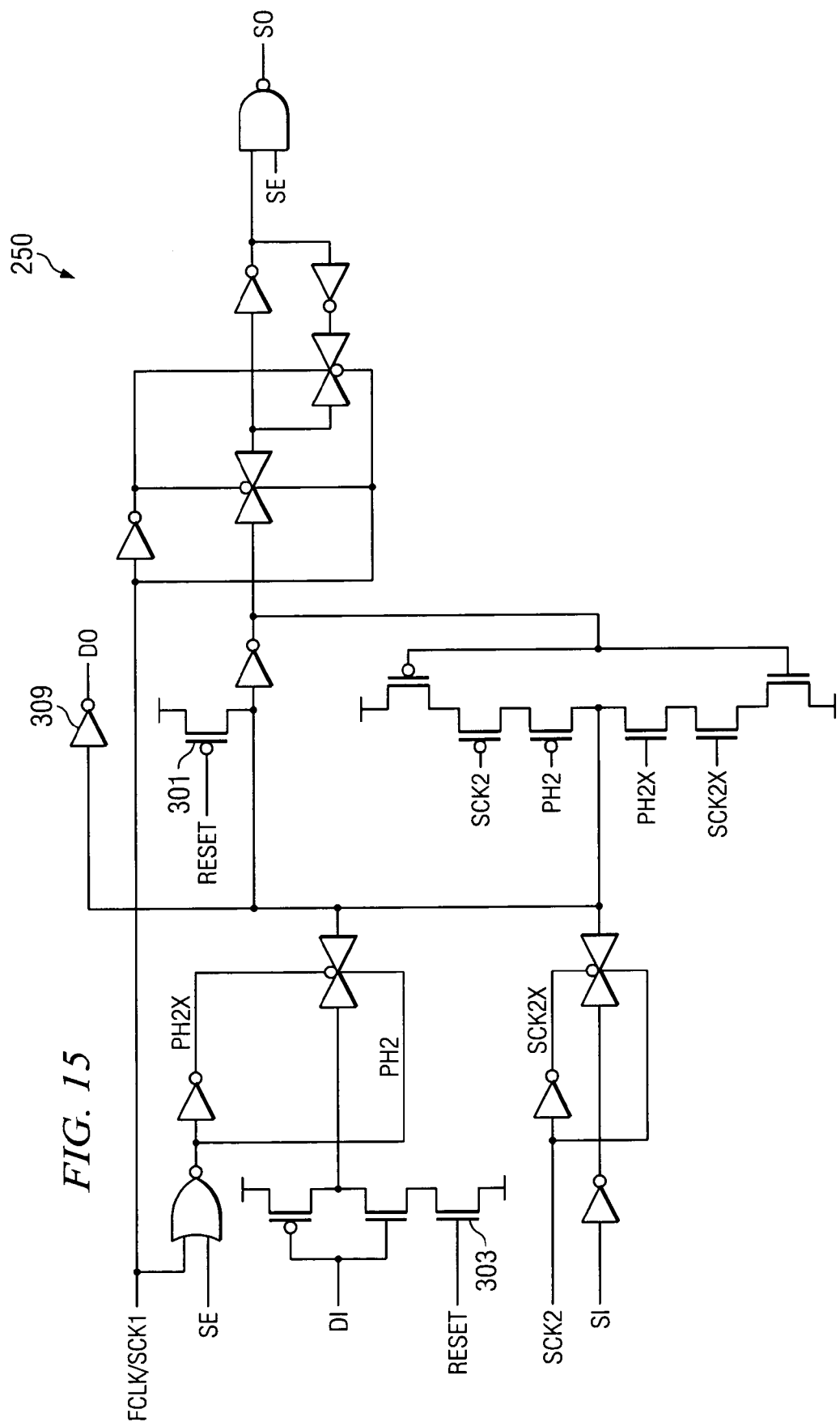
FIG. 15 shows a schematic of a negative level latch with asynchronous reset capability in accordance with embodiments of the invention.

Reset functionality is implemented in the latch 250 of FIG. 7 as shown in FIG. 15. The reset functionality is implemented using transistors in a manner similar to that used in the latch 200. One end of a PMOS transistor 301 is coupled to a voltage source, while the other end of the transistor 301 is coupled to the input of the inverter 309. To reset the latch 250, a low RESET signal is applied to the input of the transistor 301, thereby turning on the transistor 301. Because the transistor 301 is turned on, a high signal passes from the transistor 301 to the input of the inverter 309, which inverter 309 inverts the high signal to a low signal and outputs the low signal at output DO. An NMOS transistor 303 is used to prevent a short circuit situation similar to those previously described.

Figure 16:
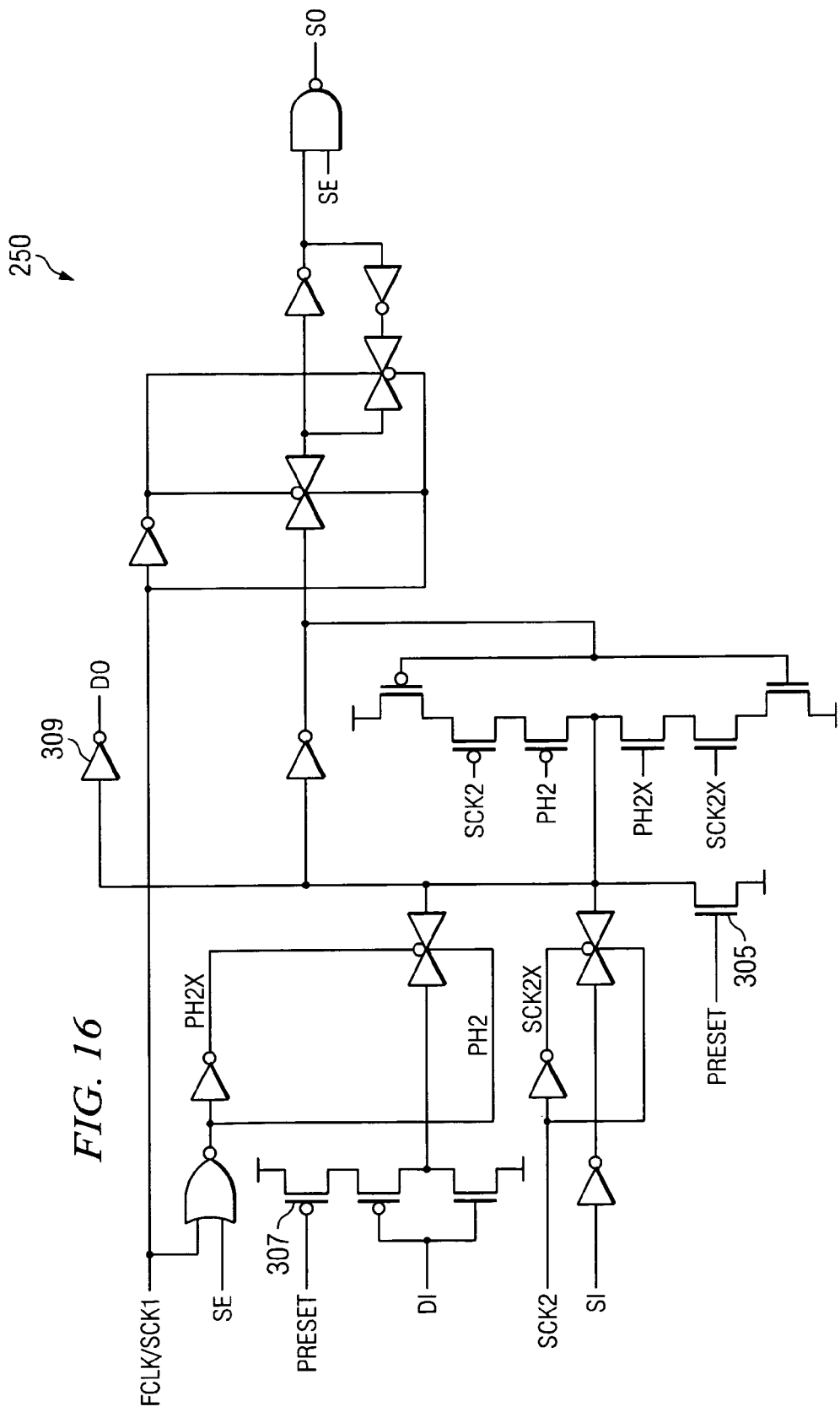
FIG. 16 shows a schematic of a negative level latch with asynchronous preset capability in accordance with embodiments of the invention.

Preset functionality is implemented in the latch 250 of FIG. 7 as shown in FIG. 16. The preset functionality is implemented using transistors in a manner similar to that used to implement reset functionality in the latch 250 of FIG. 15. One end of an NMOS transistor 305 is coupled to ground, while the other end is coupled to the input of the inverter 309. To preset the latch 250, a high PRESET signal is applied to the input of the transistor 305, thereby turning on the transistor 305. Because the transistor 305 is turned on, a low signal passes from the transistor 305 to the input of the inverter 309, which inverter 309 inverts the low signal to a high signal and outputs the high signal at output DO. A PMOS transistor 307 is used to prevent a short circuit situation similar to those previously described.

In at least some ICs, the functional clock to each flip-flop may be gated on and off by logic external to the flip-flops. An enable signal is provided to such external clock gating circuitry and, in some embodiments, gated by way of a NAND gate with the clock signal. If the enable signal is set to a certain state (e.g., low), the output clock signal from the external clock gating circuitry is held high, thus precluding normal clock oscillations. While generally effective, such external clock gating circuitry imposes a burden on the timing of the enable signal. Specifically, assertion of the enable signal to the external clock gating circuitry must satisfy the timing required by the setup time of the flip-flops as well as the time delay imposed by the gating circuitry itself.

Figure 17:
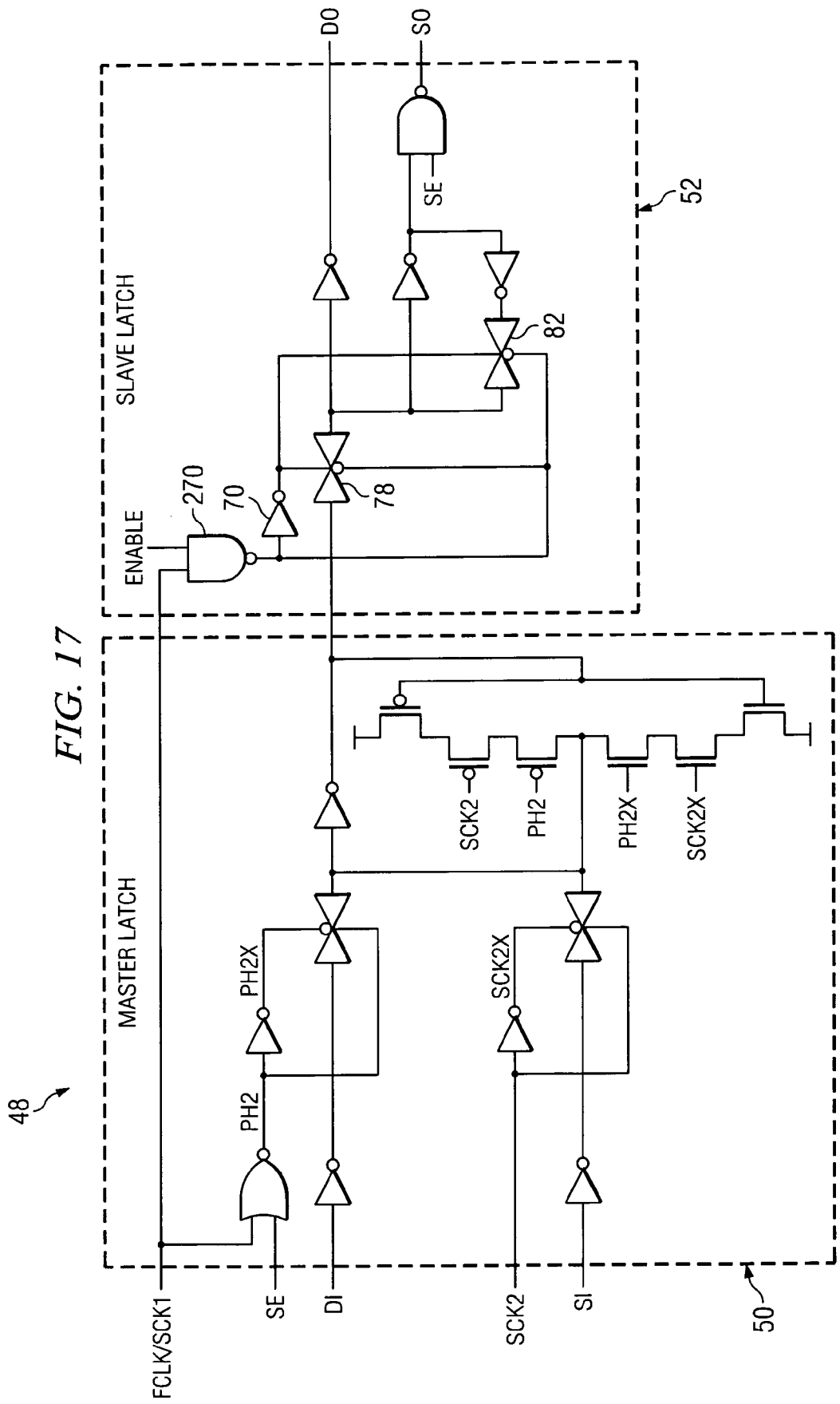
FIG. 17 shows a schematic of a positive edge flip-flop with integrated enable in accordance with embodiments of the invention.

FIG. 17 shows the positive edge flip-flop 48 of FIG. 2 comprising the master latch 50 coupled to the slave latch 52. The embodiment of FIG. 17 differs from that of FIG. 2 in that the slave latch 52 comprises a NAND gate 270. NAND gate 270 receives as inputs FCLK/SCK1 from the master latch and an enable signal as shown. The output of the NAND gate 270 is provided to inverter 70. The rest of the circuit of FIG. 17 is largely the same and operates largely the same as that shown in FIG. 2.

The enable signal is generated by logic external to the flip-flop 48. When the enable signal is a logic high, the NAND gate 270 functions as an inverter and permits normal flip-flop operation as described above. When enable is low, however, the output of the NAND gate 270 is high thereby opening the slave latch's pass gates 78 and 82 which, in turn, freezes the DO output of the slave latch and thus the flip-flop 48.

Freezing the output state of the flip-flop when enable is low is a desired behavior even for the external clock circuitry noted above. In accordance with the preferred embodiments of the invention, however, by including the NAND gate 270 inside the slave latch 52 of the flip-flop, rather than in the external clock gating circuitry, only the slave latch 52 is affected by the delay caused by the NAND gate 270 itself. The timing of the master latch 50 is unaffected by the delay of the NAND gate 270. Consequently, setup and hold time requirements are not exacerbated by the inclusion of the NAND enable gate 270 in the flip-flop, which would be the case if the NAND gate 270 was in the external clock gating circuitry.

The embodiment of FIG. 17 can be extended to negative edge flip-flops as well as positive and negative level latches. That is, the clock to the slave latches in such other embodiments can be gated off in the same way or similar to that described above.

Figure 18:
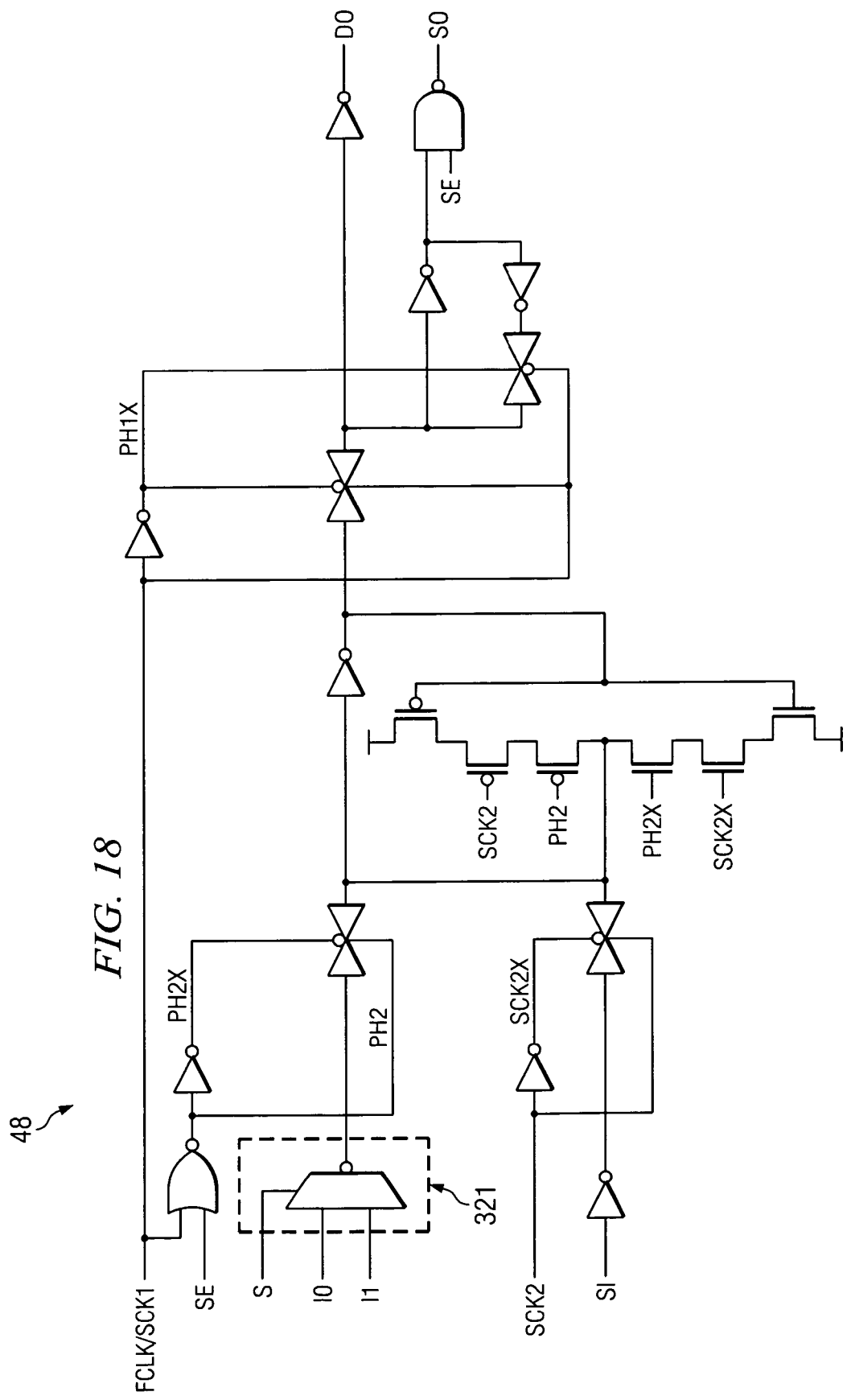
FIG. 18 shows a schematic of a positive edge flip-flop with an integrated 2-input multiplexer in accordance with embodiments of the invention.

FIG. 18 shows the flip-flop 48 of FIG. 2, except with an inverting, 2 input, 1 output (i.e., "2-to-1") multiplexer 321 substituted for the inverter 56 of FIG. 2. The inverting multiplexer 321 is obtained from logic outside the flip-flop 48 as a non-inverting multiplexer. Although the inverter 56 is being replaced, the function of the inverter 56 is maintained by converting the non-inverting multiplexer to an inverting multiplexer.

Although a multiplexer 321 is shown in place of the inverter 56, other logic (preferably inverting logic) also may be used to replace the inverter 56. For instance, an AND gate on the data path outside the flip-flop 48 may be moved inside the flip-flop 48 and converted to a NAND gate, which NAND gate is used to replace the inverter 56. Similarly, an OR gate on the data path outside the flip-flop 48 may be moved inside the flip-flop 48 and converted to a NOR gate, which NOR gate is used to replace the inverter 56. Such replacement of the inverter 56 provides for a more efficient use of space on the IC 10 and also enhances the performance efficiency of the IC 10 by eliminating the delay associated with at least one gate from the IC 10. The scope of disclosure is not limited to replacing the inverter 56 with any particular type of circuit logic.

Figure 19:
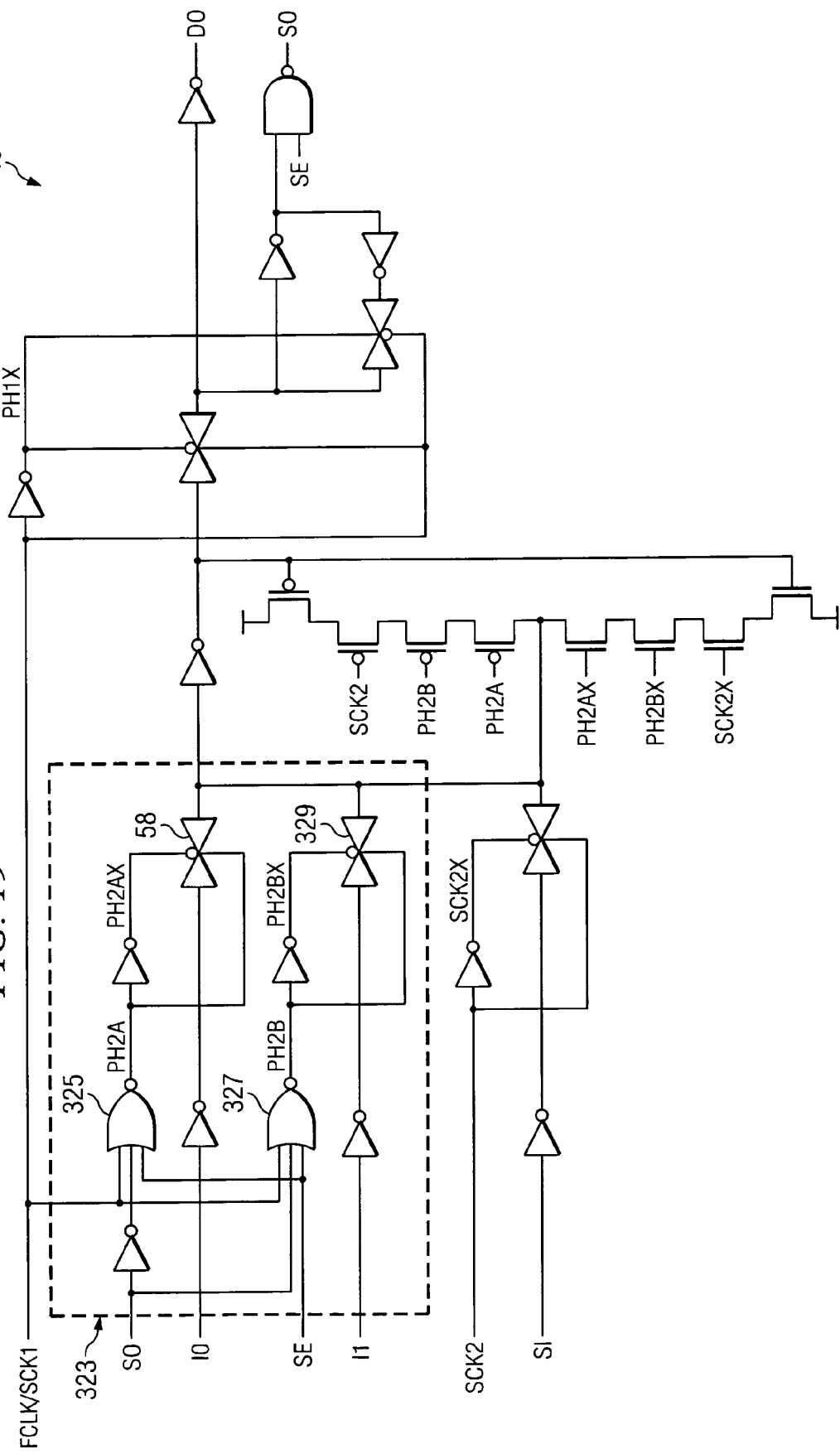
FIG. 19 shows another schematic of a positive edge flip-flop with an integrated 2-input multiplexer in accordance with embodiments of the invention.

Another embodiment of the flip-flop 48 comprising a 2-to-1 multiplexer is shown in FIG. 19. Specifically, the flip-flop 48 of FIG. 19 comprises an inverting 2-to-1 multiplexer 323. The multiplexer 323 comprises two input signals I0, I1. The multiplexer 323 comprises a select signal SO. The select signal SO is fed into 3-input NOR gate 325, while the inverse of the select signal SO is fed into the 3-input NOR gate 327. Thus, for a given status of select signal SO, one of the pass gates 58, 329 is closed and the other pass gate is open. In case the pass gate 58 is closed, the inverted version of the input signal I0 passes through the multiplexer 323. In case the pass gate 329 is closed, the inverted version of the input signal I1 passes through the multiplexer 323.

Figure 20:
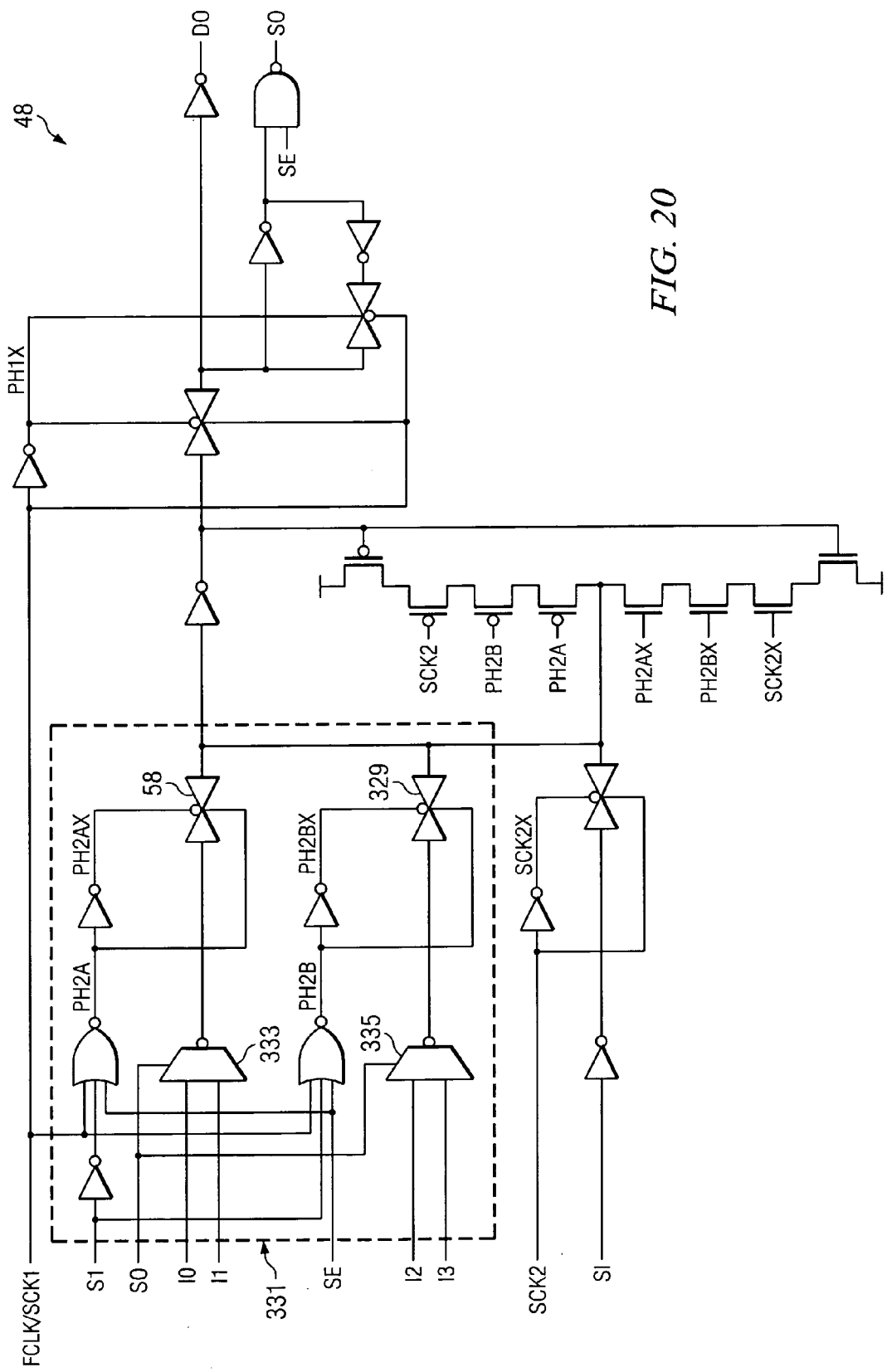
FIG. 20 shows a schematic of a positive edge flip-flop with an integrated 4-input multiplexer in accordance with embodiments of the invention.

In another embodiment, the 2-to-1 multiplexer implementation shown in the flip-flop 48 of FIG. 19 may be extended to become a 4-to-1 multiplexer. FIG. 20 shows such a 4-to-1 multiplexer 331. The multiplexer 331 is similar to the multiplexer 323, except that in the multiplexer 331, the I0 input to the multiplexer 323 is replaced with an inverting 2-to-1 multiplexer 333. Similarly, in the multiplexer 331, the I1 input to the multiplexer 323 is replaced with an inverting 2-to-1 multiplexer 335. The multiplexer 331 receives four input signals I0, I1, I2 and I3. Input signals I0, I1 are fed into the multiplexer 333, whereas input signals I2, I3 are fed into the multiplexer 335. The multiplexers 333, 335 receive a select signal SO. In operation, the output of the multiplexer 333 is selected from the inputs I0, I1 based on the status of the select signal SO. Similarly, the output of the multiplexer 335 is selected from the inputs I2, I3 based on the status of the select signal SO. The outputs of multiplexers 333, 335 are passed to the pass gates 58, 329, respectively. Pass gates 58, 329 are closed or open depending on the state of the select signal S1. When the pass gate 58 is closed, the pass gate 329 is open, and while the pass gate 329 is closed, the pass gate 58 is open. Thus, the output of the multiplexer 331 is selected from the outputs of the multiplexers 333, 335 based on the select signal S1.

Figure 21:
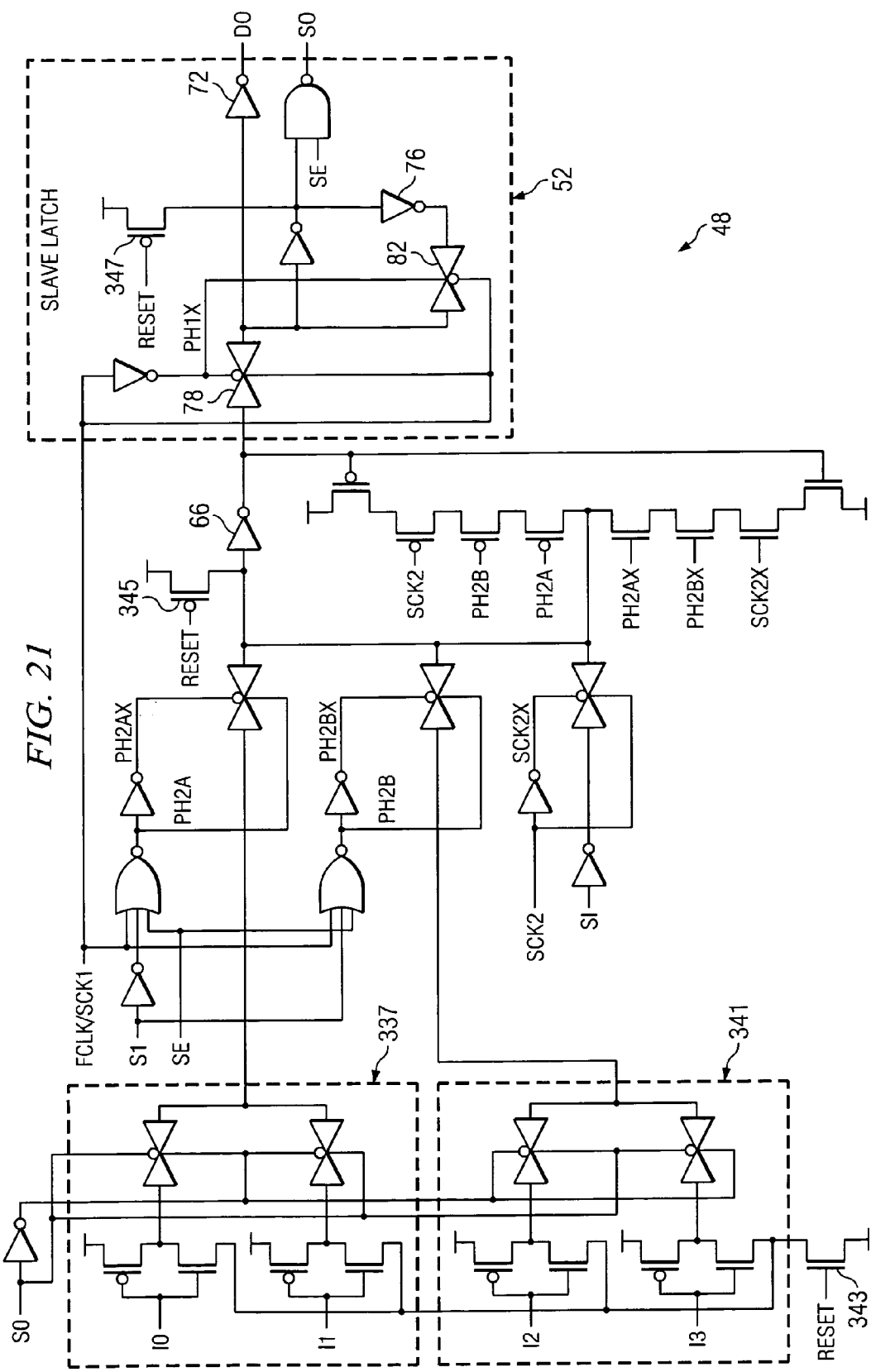
FIG. 21 shows a schematic of a positive edge flip-flop with an integrated 4-input multiplexer and asynchronous reset capability in accordance with embodiments of the invention.

In some embodiments, the flip-flop 48 shown in FIG. 20 may be modified to contain asynchronous reset and preset functionality. FIG. 21 shows the flip-flop 48 of FIG. 20 modified to comprise asynchronous reset functionality. The 2-to-1 multiplexer 333 of FIG. 20 is represented in FIG. 21 by logic 337. Similarly, the 2-to-1 multiplexer 335 of FIG. 20 is represented in FIG. 21 by logic 341. The flip-flop 48 of FIG. 21 also comprises additional transistors 343, 345, 347. When the clock signal FCLK/SCK1 is low, PMOS transistor 347 is used to reset the slave latch 52, thereby resetting the flip-flop 48. One end of transistor 347 is coupled to a voltage source, and the other end of the transistor 347 is coupled to the input of inverter 76. The input to the transistor 347 is the signal RESET. When the signal RESET is low, the transistor 347 turns on, thus providing a high signal to the input of the inverter 76. The inverter 76 outputs a low signal, which signal passes through the pass gate 82 and pulls down the voltage of the slave latch 52 at the input to the inverter 72. In this way, the slave latch 52 is reset. Because the slave latch 52 is reset, the flip-flop 48 is reset.

When the clock signal FCLK/SCK1 is high, the pass gate 78 is closed and the pass gate 82 is open. Because the pass gate 82 is open, the transistor 347 cannot be used to reset the flip-flop 48. Instead, PMOS transistor 345 is used to reset the flip-flop 48. One end of the transistor 345 is coupled to a voltage source, while the other end is coupled to the input of the inverter 66. The input to the transistor 345 is the RESET signal. When the RESET signal is low, the transistor 345 turns on, thereby providing a high signal to the inverter 66. In turn, the inverter 66 outputs a low signal, which low signal passes through the pass gate 78 and to the input of the inverter 72. In this way, the slave latch 52 and the flip-flop 48 are reset. NMOS transistor 343 is used to prevent short circuits in the same manner as the transistor 61 of FIG. 9. The scope of disclosure is not limited to the specific embodiments described above. For example, the techniques used to modify the flip-flop 48 of FIG. 20 to include RESET functionality may be extended to implement PRESET functionality as well. Likewise, the RESET and PRESET functionality, as well as the 2-to-1 and 4-to-1 multiplexer implementations described above, may be applied to the flip-flop 150 of FIG. 5 in addition to the flip-flop 48 of FIG. 2. The multiplexers used in FIGS. 18-21 generally are implemented for space conservation reasons as well as to provide noise immunity for circuitry coupled to the multiplexers. As such, the embodiments of FIGS. 18-21 can be extended to any of a variety of flip-flops and latches, including positive edge flip-flops, negative edge flip-flops, positive level latches and negative level latches.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The invention claimed is:

1. An apparatus comprising:
   a plurality of clock input ports that are each adapted to receive at least one of a plurality of clock signals;
   a scan input port adapted to receive scan data signals;
   data input ports adapted to receive functional data signals; and
   an enable signal port adapted to receive an enable signal;
   a pass gate enable signal port that is adapted to receive a pass gate enable signal;
   a multiplexer including:
      a first inverter that is coupled to at least one of the data input ports;
      a second inverter that is coupled to at least one of the data input ports;
      a first pass gate that is coupled to the first inverter;
      a second pass gate that is coupled to the second inverter; and
      a NOR gate that is coupled to the pass gate enable port, the enable port, and at least one of the clock input ports so as to activate or deactivate at least one of the first or second pass gates;
   a third inverter that is coupled to the scan input port; and
   a third pass gate that is coupled to the third inverter, at least one of the clock input ports, the first pass gate, and the second pass gate.

2. The apparatus of claim 1, wherein the multiplexer further comprises a two-input, one-output multiplexer.

3. The apparatus of claim 1, wherein the apparatus is a positive level latch.

4. The apparatus of claim 1, wherein the multiplexer further comprises a third inverter that is coupled between the pass gate enable signal port and the NOR gate.

5. An apparatus comprising:
   a multiplexer with a plurality of input ports, a plurality of enable ports, and a first clock port, wherein the multiplexer includes:
      a first inverter that is coupled to at least one of the input ports;
      a second inverter that is coupled at least one of the input ports;
      a third inverter that is coupled to at least one of the enable ports;
      a first pass gate that is coupled to the first inverter;
      a second pass gate that is coupled to the second inverter;
      a first NOR gate that is coupled to the first clock port, at least one of the enable ports, and the first pass gate, wherein the first NOR gate activates and deactivates the first pass gate; and
      a second NOR gate that is coupled to the first clock port, the third inverter, and the second pass gate, wherein the second NOR gate activates and deactivates the second pass gate;
   a fourth inverter that is coupled to a scan input port; and
   a third pass gate that is coupled to the third inverter.

6. The apparatus of claim 5, wherein the apparatus further comprises:
   a fifth inverter that is coupled to the first, second, and third pass gates;
   a fourth pass gate that is coupled to the fifth inverter;
   a sixth inverter that is coupled to the fourth pass gate;
   a fifth pass gate that is coupled to the fourth pass gate;
   a seventh inverter that is coupled to the fifth pass gate; and
   an AND gate that is coupled to the sixth and seventh inverters.

* * * * *